US009812537B2

(12) United States Patent
Nakano

(10) Patent No.: US 9,812,537 B2
(45) Date of Patent: Nov. 7, 2017

(54) SEMICONDUCTOR DEVICE AND METHOD FOR MANUFACTURING THE SAME

(71) Applicant: ROHM CO., LTD., Kyoto-shi, Kyoto (JP)

(72) Inventor: Yuki Nakano, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/768,116

(22) PCT Filed: Feb. 14, 2014

(86) PCT No.: PCT/JP2014/053511
§ 371 (c)(1),
(2) Date: Aug. 14, 2015

(87) PCT Pub. No.: WO2014/129404
PCT Pub. Date: Aug. 28, 2014

(65) Prior Publication Data
US 2015/0380503 A1 Dec. 31, 2015

(30) Foreign Application Priority Data

Feb. 19, 2013 (JP) ................................. 2013-030018

(51) Int. Cl.
*H01L 29/78* (2006.01)
*H01L 29/423* (2006.01)
(Continued)

(52) U.S. Cl.
CPC ...... *H01L 29/4236* (2013.01); *H01L 29/0623* (2013.01); *H01L 29/1602* (2013.01);
(Continued)

(58) Field of Classification Search
CPC ....... H01L 29/423; H01L 29/16; H01L 29/20; H01L 29/66; H01L 29/78
(Continued)

(56) References Cited

U.S. PATENT DOCUMENTS 5,895,951 A 4/1999 So et al.
6,069,043 A * 5/2000 Floyd .................... H01L 29/402
257/E29.135
(Continued)

FOREIGN PATENT DOCUMENTS

JP 2002-353456 12/2002
JP 2004-022941 1/2004
(Continued)

OTHER PUBLICATIONS

International Search Report, dated May 20, 2014; PCT/JP2014/053511.
(Continued)

*Primary Examiner* — Asok K Sarkar
*Assistant Examiner* — Dmitriy Yemelyanov
(74) *Attorney, Agent, or Firm* — Hamre, Schumann, Mueller & Larson, P.C.

(57) ABSTRACT

A semiconductor device of the present invention includes a gate electrode buried in a gate trench of a first conductivity-type semiconductor layer, a first conductivity-type source region, a second conductivity-type channel region, and a first conductivity-type drain region formed in the semiconductor layer, a second trench selectively formed in a source portion defined in a manner containing the source region in the surface of the semiconductor layer, a trench buried portion buried in the second trench, a second conductivity-type channel contact region selectively disposed at a position higher than that of a bottom portion of the second trench in the source portion, and electrically connected with the channel region, and a surface metal layer disposed on the source portion, and electrically connected to the source region and the channel contact region.

27 Claims, 20 Drawing Sheets

(51) Int. Cl.
*H01L 29/40* (2006.01)
*H01L 29/66* (2006.01)
*H01L 29/06* (2006.01)
*H01L 29/16* (2006.01)
*H01L 29/20* (2006.01)
*H01L 29/10* (2006.01)

(52) U.S. Cl.
CPC ...... *H01L 29/1608* (2013.01); *H01L 29/2003* (2013.01); *H01L 29/407* (2013.01); *H01L 29/66045* (2013.01); *H01L 29/66068* (2013.01); *H01L 29/66613* (2013.01); *H01L 29/66734* (2013.01); *H01L 29/78* (2013.01); *H01L 29/7811* (2013.01); *H01L 29/7813* (2013.01); *H01L 29/0653* (2013.01); *H01L 29/0696* (2013.01); *H01L 29/1095* (2013.01)

(58) Field of Classification Search
USPC .................................. 257/77, 76; 438/270
See application file for complete search history.

(56) References Cited

U.S. PATENT DOCUMENTS

| | | |
|---|---|---|
| 2002/0179976 A1 | 12/2002 | Takahashi |
| 2004/0041171 A1 | 3/2004 | Ogura et al. |
| 2008/0138953 A1* | 6/2008 | Challa ................ H01L 21/3065 438/270 |
| 2012/0261676 A1 | 10/2012 | Nakano |
| 2012/0280255 A1 | 11/2012 | Masuda et al. |
| 2012/0326207 A1 | 12/2012 | Yoshimochi |
| 2013/0306983 A1 | 11/2013 | Nakano et al. |

FOREIGN PATENT DOCUMENTS

| | | |
|---|---|---|
| JP | 2004-055968 | 2/2004 |
| JP | 2007123570 | 5/2007 |
| JP | 2007529115 | 10/2007 |
| JP | 2009099863 | 5/2009 |
| JP | 2011-134910 | 7/2011 |
| JP | 2011165941 | 8/2011 |
| JP | 2012099601 | 5/2012 |
| JP | 2012-178536 | 9/2012 |
| JP | 2013033931 | 2/2013 |
| WO | 2005065385 | 7/2005 |

OTHER PUBLICATIONS

International Preliminary Report on Patentability and Written Opinion, and English translation, PCT/JP2014/053511, dated Sep. 3, 2015 (10 pages).

Office Action issued for Japanese Patent Application No. 2013-030018, dated Feb. 2, 2017, 4 pages.

* cited by examiner

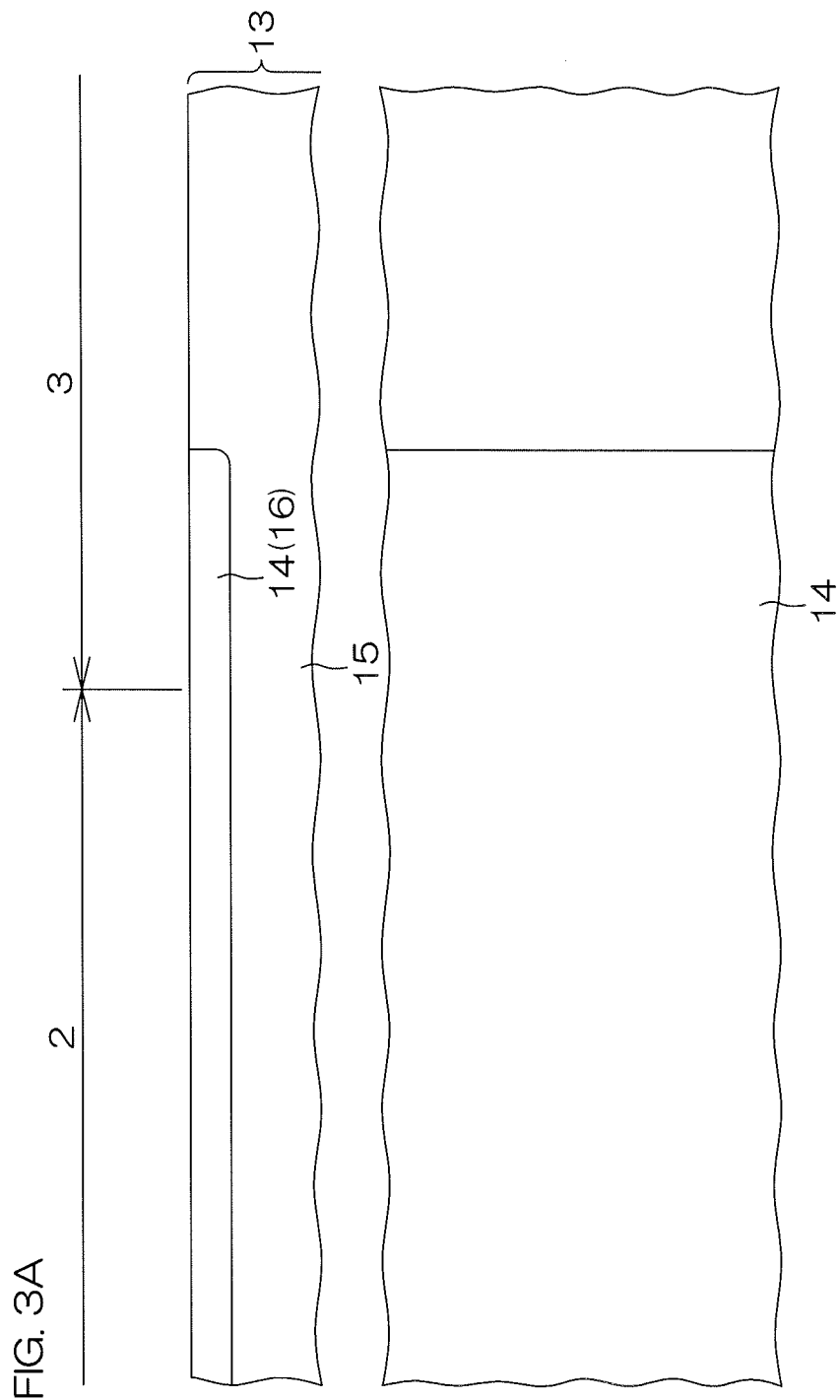

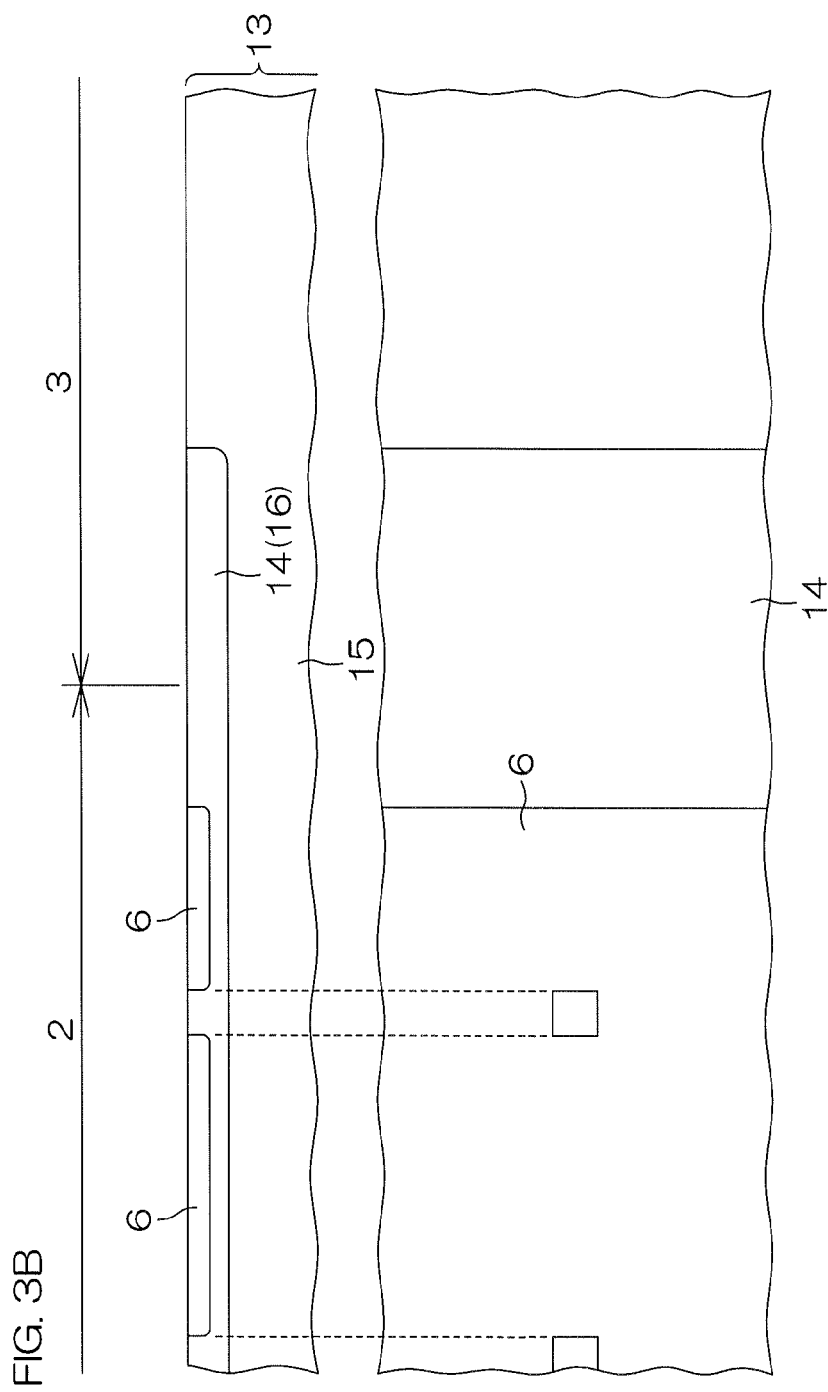

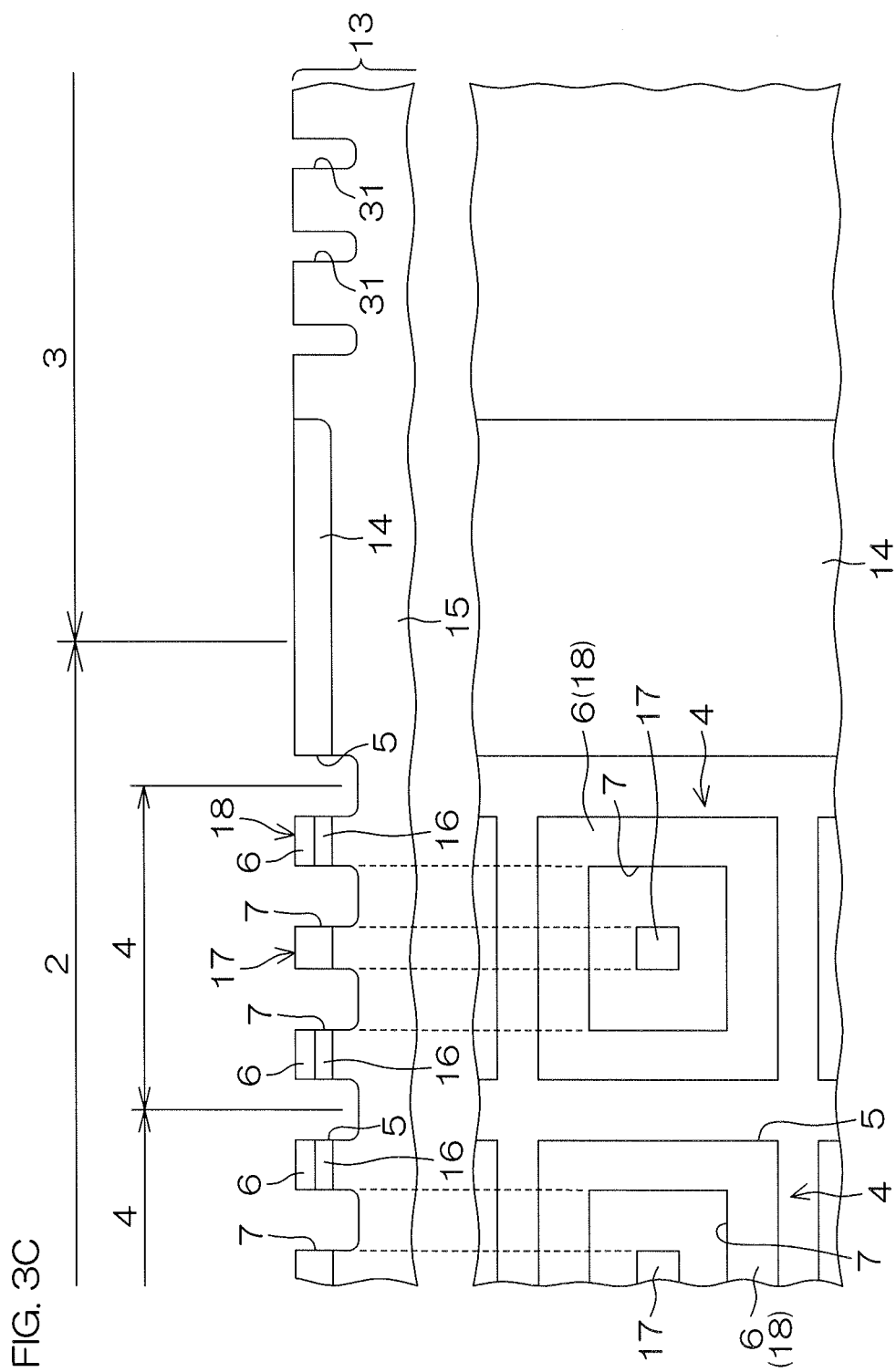

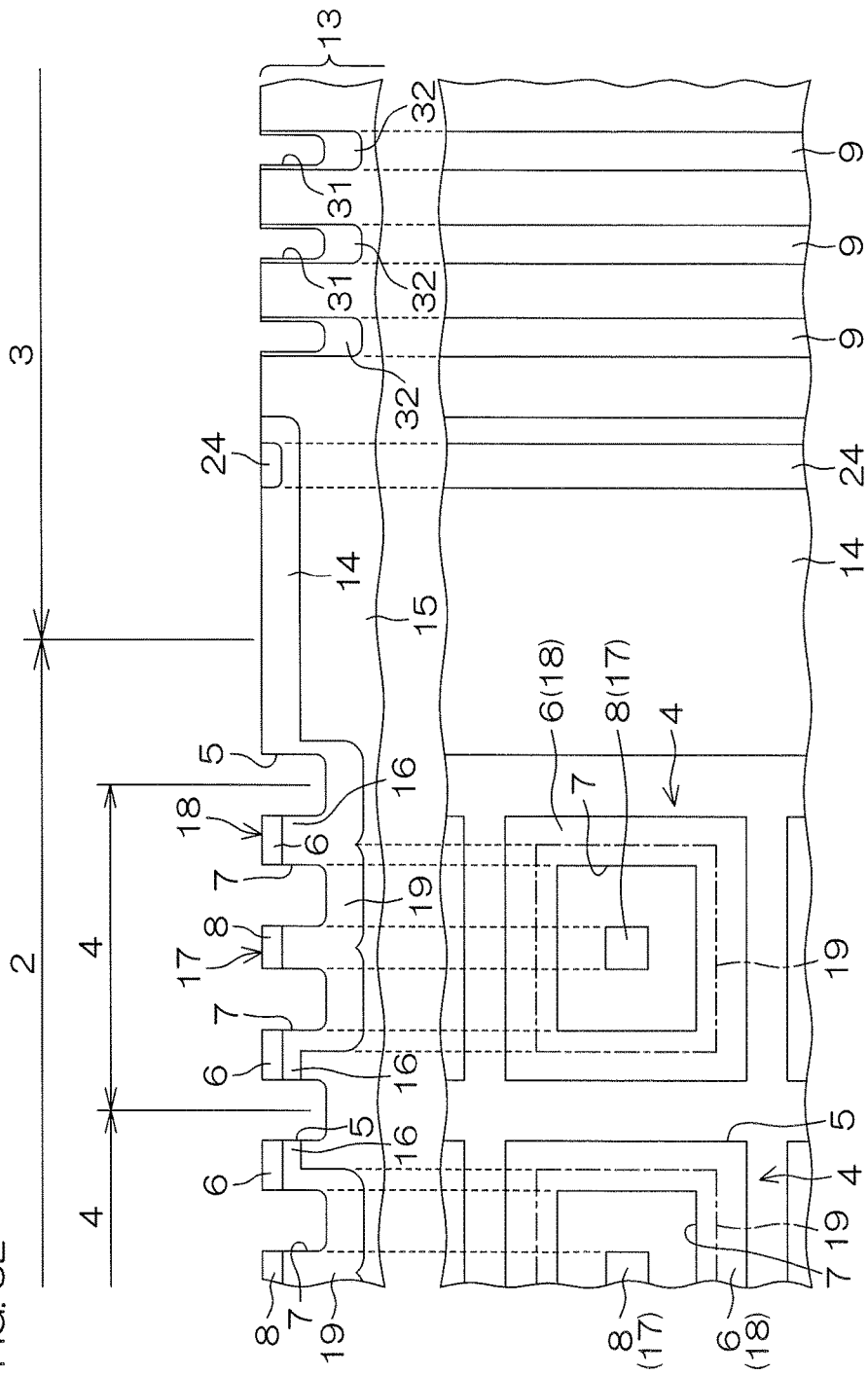

FIG. 7B

SEMICONDUCTOR DEVICE AND METHOD FOR MANUFACTURING THE SAME

TECHNICAL FIELD

The present invention relates to a semiconductor device having a trench-gate structure and a method for manufacturing the same.

BACKGROUND ART

Semiconductor power devices have conventionally become the focus of attention, which are mainly used for systems in various power electronics fields such as motor control systems and power conversion systems.

As semiconductor power devices of this type, SiC semiconductor devices having a trench-gate structure have been proposed, for example.

For example, Patent Literature 1 discloses a field effect transistor including an $n^+$-type SiC substrate, an $n^-$-type epitaxial layer (drift region) formed on the SiC substrate, a p-type body region formed at a surface side of the epitaxial layer, an $n^+$-type source region formed at a surface side within the body region, a grid-shaped gate trench formed in a manner penetrating through the source region and the body region to reach the drift region, a gate insulating film formed on the inner surface of the gate trench, a gate electrode embedded in the gate trench, a source trench formed in a manner penetrating through the source region and the body region to reach the drift region at a position surrounded by the grid-shaped gate trench, and a source electrode formed in a manner entering the source trench.

CITATION LIST

Patent Literature

Patent Literature 1: Japanese Patent Application Publication No. 2011-134910

SUMMARY OF INVENTION

Technical Problem

It is an object of the present invention to provide a semiconductor device capable of improving the flatness of a surface metal layer without sacrificing conventional device performance and a method for manufacturing the same.

Solution to Problem

A semiconductor device of the present invention for achieving the above object includes a semiconductor layer of a first conductivity type formed with a gate trench, a gate electrode buried in the gate trench via a gate insulating film, a source region of a first conductivity type disposed in a manner exposed on a surface of the semiconductor layer, forming a part of a side face of the gate trench, a channel region of a second conductivity type disposed for the source region on a back surface side of the semiconductor layer in a manner contacting the source region, forming a part of the side face of the gate trench, a drain region of a first conductivity type disposed for the channel region on the back surface side of the semiconductor layer in a manner contacting the channel region, forming a bottom face of the gate trench, a second trench selectively formed in a source portion defined in a manner containing the source region in the surface of the semiconductor layer, a trench buried portion buried in the second trench, a channel contact region of a second conductivity type selectively disposed at a position higher than that of a bottom portion of the second trench in the source portion, electrically connected with the channel region, and a surface metal layer disposed on the source portion, electrically connected to the source region and the channel contact region.

According to this arrangement, because the trench buried portion is buried in the second trench, a difference in level (unevenness) between the source portion and other parts can be reduced on the surface of the semiconductor layer (device surface). The flatness of the surface metal layer on said device surface can thereby be improved. Thus, when, for example, a wire is bonded to the surface metal layer, adhesion between the surface metal layer and the wire can be improved. As a result, the wire can be satisfactorily bonded, so that the wire bonding portion can be improved in reliability. Further, because the surface metal layer is excellent in flatness, destruction of the device by ultrasonic vibration and pressure can be prevented at the time of wire bonding, and a decline in assembling yield can be prevented.

On the other hand, a concentration of equipotential surfaces in the vicinity of a bottom portion of the gate trench can be prevented by the second trench, so that a potential gradient in the vicinity of the bottom port ion can be made gradual. Therefore, an electric field concentration to the bottom portion of the gate trench can be relaxed. Further, because the channel contact region is disposed at a position higher than that of the bottom portion of the second trench, even when there is formed a second trench, contact with the channel region can be reliably made via the channel contact region. In other words, at the time of an improvement in flatness of the surface metal layer, a degradation in device performance such as gate withstand voltage and contact performance with the channel region can be prevented.

The semiconductor device of the present invention may further include a second conductivity-type layer formed at the bottom portion and a side portion of the second trench in a manner continuing from the channel region and the channel contact region.

According to this arrangement, a depletion layer can be generated, by a second conductivity-type layer different in conductivity type from the semiconductor layer, from a junction (p-n junction) between said second conductivity-type layer and the semiconductor layer. Moreover, because the depletion layer keeps equipotential surfaces away from the gate trench, electric fields to be imposed on the bottom portion of the gate trench can be further relaxed.

The trench buried portion may consist of an insulating film formed on an inner surface of the second trench and a polysilicon layer buried inside of the insulating film.

According to this arrangement, the polysilicon layer buried in the second trench can be used as an etching stopper, in the case where, for example, there is formed a surface insulating film made of $SiO_2$ on the surface of the semiconductor layer, when selectively etching the surface insulating film to expose the source portion from a contact hole. Therefore, control of the step of said contact etching can be simply performed.

The insulating film may be made of any of $SiO_2$, AlON, $Al_2O_3$, $SiO_2$/AlON, $SiO_2$/AlON/$SiO_2$, $SiO_2$/SiN, and $SiO_2$/SiN/$SiO_2$.

According to this arrangement, by, for example, forming the gate insulating film in the same step as that for the insulating film in the second trench, a gate insulating film constituted of a material exemplified in the above can be provided. In this case, providing a gate insulating film constituted of a high-dielectric-constant (high-k) film of AlON, $Al_2O_3$, or the like allows an improvement in gate withstand voltage, so that device reliability can be improved.

The insulating film may have a $SiO_2$ film containing nitrogen (N).

According to this arrangement, by, for example, forming the gate insulating film in the same step as that for the insulating film in the second trench, a gate insulating film constituted of a material having a $SiO_2$ film containing nitrogen (N) can be provided. This gate insulating film can improve channel mobility.

The insulating film may be, at the bottom portion of the second trench, formed to be thicker than a part at a side portion of the second trench.

According to this arrangement, by, for example, forming the gate insulating film in the same step as that for the insulating film in the second trench, the gate insulting film can also be made, at the bottom portion of the gate trench, thicker than a part at a side portion of the gate trench. Withstand voltage in the bottom portion of the gate trench can thereby be improved.

The polysilicon layer may be made of $n^+$-type polysilicon.

According to this arrangement, by, for example, forming the gate electrode in the same step as that for the polysilicon layer in the second trench, a gate electrode constituted of $n^+$-type polysilicon can be provided. The $n^+$-type polysilicon has a relatively low sheet resistance, which therefore allows increasing transistor switching speed.

The trench buried portion may consist of an insulating layer that fills back the second trench.

According to this arrangement, because the inside of the second trench is filled with the insulating layer, a leakage current that flows via the second trench can be prevented or reduced.

The insulating layer may be made of $SiO_2$. In this case, the insulating layer may be made of $SiO_2$ containing phosphorus (P) or boron (B).

According to this arrangement, because the melting point of $SiO_2$ falls as a result of containing phosphorous or boron, the process for burying the insulating film can be simply performed. As such $SiO_2$, for example, PSG (phosphorus silicate glass) or PBSG (phosphorus boron silicate glass) can be used.

The trench buried portion may consist of a polysilicon layer that fills back the second trench.

According to this arrangement, the polysilicon layer buried in the second trench can be used as an etching stopper, in the case where, for example, there is formed a surface insulating film made of $SiO_2$ on the surface of the semiconductor layer, when selectively etching the surface insulating film to expose the source portion from a contact hole. Therefore, control of the step of said contact etching can be simply performed.

The polysilicon layer may be made of $p^+$-type polysilicon.

According to this arrangement, when, for example, the channel region and the channel contact region are p-type, these regions can be electrically connected by use of a $p^+$-type polysilicon layer. Because the length of a current path between the channel region and the channel contact region can thereby be reduced, a base resistance therebetween can be reduced. As a result, latch-up can be satisfactorily prevented. Further, when the channel contact region is in contact with the polysilicon layer, a contact resistance therebetween can also be reduced. The reduction in contact resistance also contributes to a reduction in the base resistance between the channel region and the channel contact region.

The gate electrode may be a metal gate electrode containing any of Mo, W, Al, Pt, Ni, and Ti.

According to this arrangement, gate resistance can be made relatively low, which therefore allows increasing transistor switching speed.

The surface metal layer may be made of a metal containing copper (Cu). In this case, the surface metal layer may contain an Al—Cu-based alloy.

According to this arrangement, because the sheet resistance of the surface metal layer can be reduced, the current density can be increased.

The second trench may have an annular structure surrounding the channel contact region.

The second trench may have a width the same as that of the gate trench.

According to this arrangement, when, for example, the gate trench and the second trench are formed in the same step, the etching rate for the second trench can be made the same as that for the gate trench, so that etching for forming the second trench can be stably controlled.

The semiconductor layer may have an active region that forms a channel in the channel region to perform a transistor operation and an outer peripheral region disposed around the active region, and the semiconductor device may further include a surface insulating film disposed in a manner extending across the active region and the outer peripheral region, and in the active region, formed to be thinner than a part in the outer peripheral region. In this case, the surface insulating film may have a thickness of 5000 Å or less in the active region.

Also, in the surface insulating film, a contact hole that selectively exposes the source portion may be formed over the entire surface of the semiconductor layer.

In the semiconductor layer, a unit cell that forms a channel in the channel region to perform a transistor operation may be defined in a grid shape by the gate trench. Or, in the semiconductor layer, a unit cell that forms a channel in the channel region to perform a transistor operation may be defined in a striped shape by the gate trench.

The semiconductor layer may be made of SiC, GaN, or diamond.

A method for manufacturing a semiconductor device of the present invention includes a step of simultaneously forming, in a semiconductor layer formed with a source region of a first conductivity type, a channel region of a second conductivity type, and a drain region of a first conductivity type in order from a surface side to a back surface side in a manner contacting each other, a gate trench and a second trench that penetrate through the source region and the channel region from the surface to reach the drain region, a step of selectively forming a channel contact region of a second conductivity type to be electrically connected with the channel region, at a position higher than that of a bottom portion of the second trench in the semiconductor layer, a step of burying a gate electrode via a gate insulating film in the gate trench, a step of burying a trench buried portion in the second trench, a step of selectively exposing a source portion containing the source region, the channel contact region, and the trench buried port ion in the surface of the semiconductor layer, and selectively covering a part other than the source portion, and a step of forming, on the source portion, a surface metal layer to be electrically connected to the source region and the channel contact region.

According to this method, because a semiconductor device of the present invention can be manufactured, a semiconductor device capable of improving the flatness of a surface metal layer without sacrificing conventional device performance can be provided.

Also, because the second trench is formed simultaneously with the gate trench, the second trench can be simply formed free from misalignment, without increasing the manufacturing process.

The method of the semiconductor device of the present invention may further include a step of forming a second conductivity-type layer at the bottom portion and a side portion of the second trench in a manner continuing from the channel region and the channel contact region.

According to this method, a depletion layer can be generated, by a second conductivity-type layer different in conductivity type from the semiconductor layer, from a junction (p-n junction) between said second conductivity-type layer and the semiconductor layer. Moreover, because the depletion layer keeps equipotential surfaces away from the gate trench, electric fields to be imposed on the bottom portion of the gate trench can be further relaxed.

The step of burying the trench buried portion may include a step of forming an insulating film on an inner surface of the second trench and then burying a polysilicon layer inside of the insulating film.

According to this method, the polysilicon layer buried in the second trench can be used as an etching stopper, in the case where, for example, a surface insulating film made of $SiO_2$ is formed on the surface of the semiconductor layer, when selectively etching the surface insulating film to expose the source portion from a contact hole. Therefore, control of the step of said contact etching can be simply performed.

The step of burying the trench buried portion may include a step of filling back the second trench with an insulating layer.

According to this method, because of filling the inside of the second trench with the insulating layer, a semiconductor device capable of preventing or reducing a leakage current that flows via the second trench can be provided.

The step of burying the trench buried portion may include a step of filling back the second trench with a polysilicon layer.

According to this method, the polysilicon layer buried in the second trench can be used as an etching stopper, in the case where, for example, a surface insulating film made of $SiO_2$ is formed on the surface of the semiconductor layer, when selectively etching the surface insulating film to expose the source portion from a contact hole. Therefore, control of the step of said contact etching can be simply performed.

The step of forming the gate trench and the second trench may include a step of forming a gate trench and a second trench being the same width as each other.

According to this method, the etching rate for the second trench can be made the same as that for the gate trench, so that etching for forming the second trench can be stably controlled.

BRIEF DESCRIPTION OF DRAWINGS

FIG. 3A is a schematic view showing a part of a process for manufacturing the semiconductor device according to the first preferred embodiment of the present invention.

FIG. 3B is a view showing a step following that of FIG. 3A.

FIG. 3C is a view showing a step following that of FIG. 3B.

FIG. 3E is a view showing a step following that of FIG. 3D.

FIG. 7B is a view showing a step following that of FIG. 7A.

DESCRIPTION OF PREFERRED EMBODIMENTS

Hereinafter, preferred embodiments of the present invention will be specifically described with reference to the drawings.

First Preferred Embodiment

FIGS. 1(a) and 1(b) are a schematic plan view of a semiconductor device according to a first preferred embodiment of the present invention, in which FIG. 1(a) shows an overall view and FIG. 1(b) shows a layout diagram of a plurality of unit cells.

Figure 1:
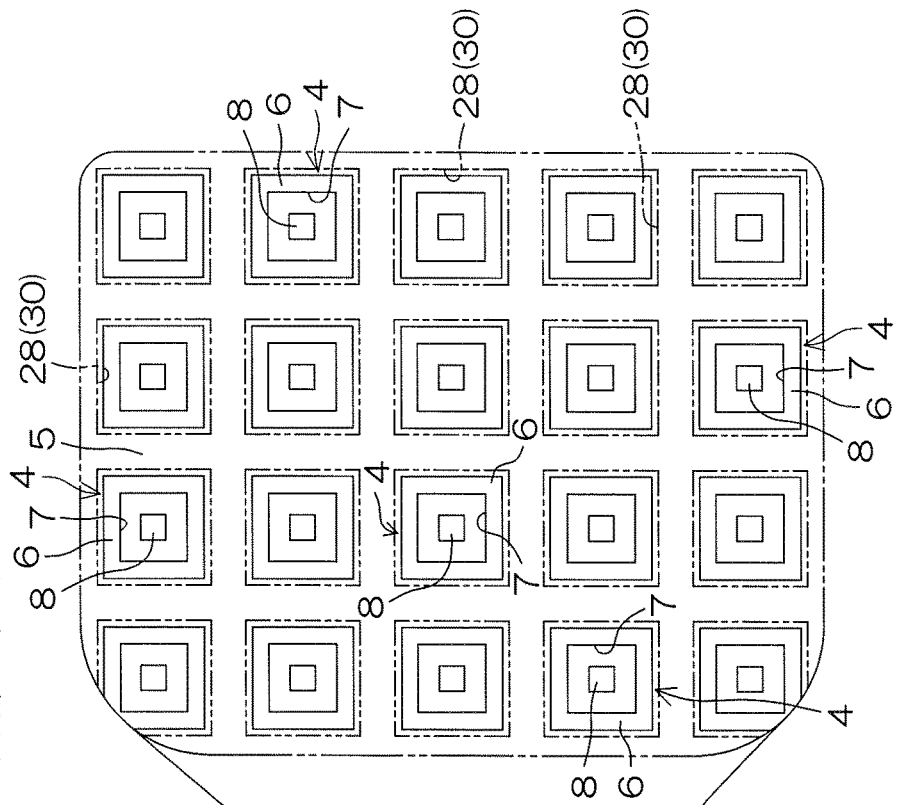
FIGS. 1(a) and 1(b) are a schematic plan view of a semiconductor device according to a first preferred embodiment of the present invention, in which FIG. 1 (a) shows an overall view and FIG. 1 (b) shows a layout diagram of a plurality of unit cells.
Figure 1:
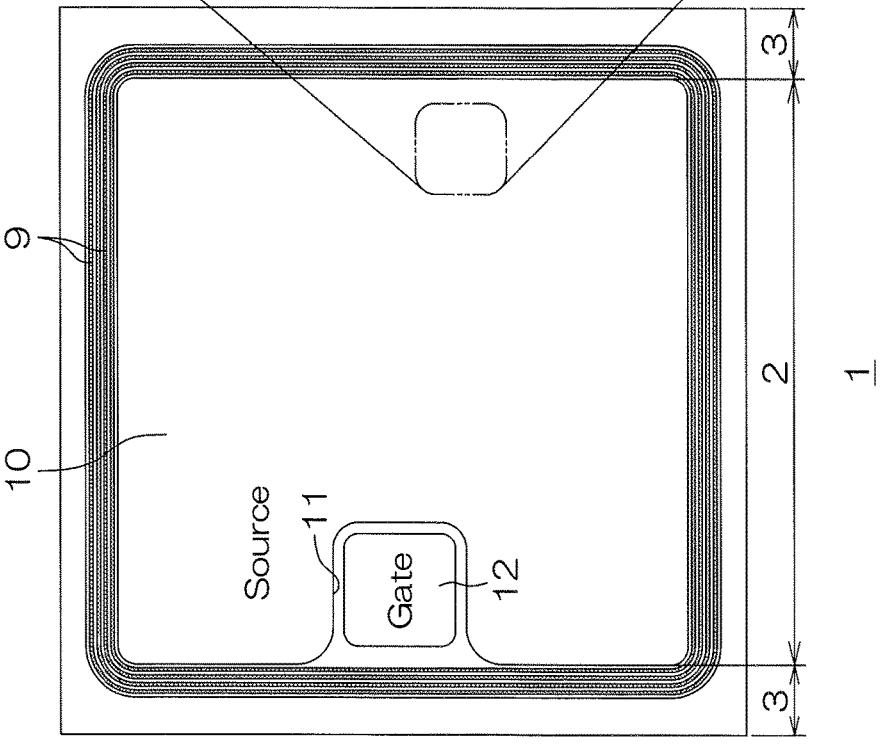

The semiconductor device 1 includes a SiC-based trench-gate type MISFET (Metal Insulator Semiconductor Field Effect Transistor). As shown in FIG. 1 (a), the semiconductor device 1 has, for example, a square chip-shaped contour in a plan view. The chip-shaped semiconductor device 1 is sized to have a vertical and horizontal length of about several millimeters in the illustration of FIG. 1 (a). An active region 2 and an outer peripheral region 3 disposed around the active region 2 are set on a surface of the semiconductor device 1.

In the active region 2, a plurality of unit cells 4 each of which performs a transistor operation are defined in a grid shape by a gate trench 5. Each unit cell 4 includes an annular $n^+$-type source region 6, an annular source trench 7 (second trench) surrounded by the $n^+$-type source region 6, and a $p^+$-type channel contact region 8 formed in an island shape inside the source trench 7. The $p^+$-type channel contact region 8 is surrounded by the source trench 7 at its periphery. Also, each unit cell 4 is sized to have a vertical and horizontal length of about 10 μm in the illustration of FIG. 1(b).

The outer peripheral region 3 is, in the present preferred embodiment, formed in an annular shape in a manner surrounding the active region 2. In the outer peripheral region 3, a plurality of guard rings 9 are formed spaced apart from each other, in a manner surrounding the active region 2. In addition, the guard rings 9 under a source pad 10 (described later) are shown perspectively in FIG. 1(a).

A source pad 10 (surface metal layer) is formed on the surface of the semiconductor device 1. The source pad 10 is formed across substantially the whole of the surface of the semiconductor device 1, in a manner extending across the plurality of unit cells 4. The source pad 2, in the present preferred embodiment, has a substantially square shape in a plan view with the four corners being curved outward. A removal region 11 is formed near the center of one side of the source pad 10. The removal region 11 is a region in which the source pad 10 is not formed.

A gate pad 12 is disposed in the removal region 11. The gate pad 12 and the source pad 10 are provided with an interval therebetween, and are insulated from each other.

Figure 2:
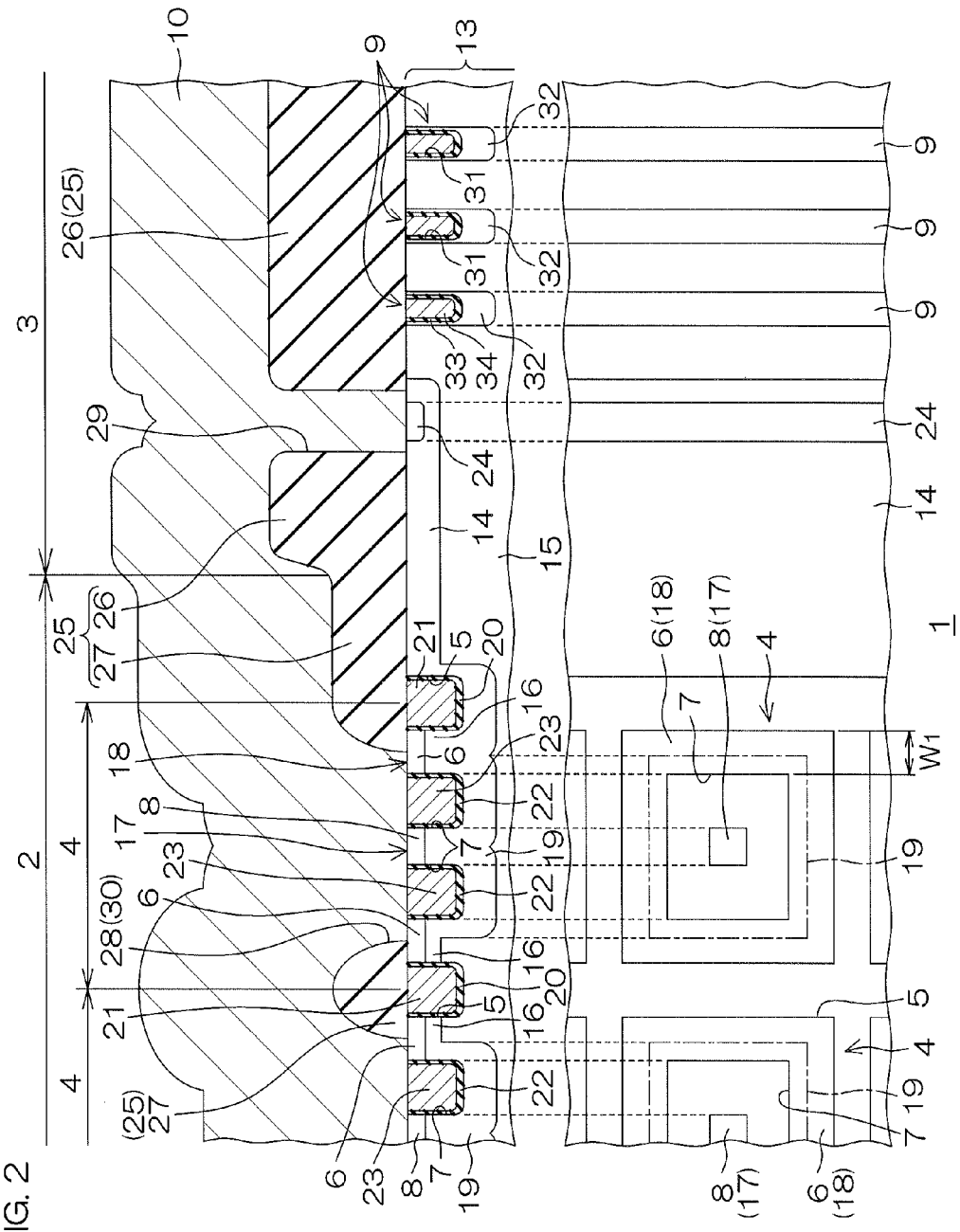
FIG. 2 is an enlarged view showing a main part of the semiconductor device according to the first preferred embodiment of the present invention, in which an upper side of the figure shows a sectional view and a lower side of the figure shows a plan view.

FIG. 2 is an enlarged view showing a main part of the semiconductor device according to the first preferred embodiment of the present invention, in which an upper side of the figure shows a sectional view, and a lower side of the figure shows a plan view.

Next, an internal structure of the semiconductor device 1 will be described.

The semiconductor device 1 includes a substrate (not shown) made of $n^+$-type SiC (for example, having a concentration of $1 \times 10^{18}$ to $1 \times 10^{21}$ $cm^{-3}$) and an $n^-$-type epitaxial layer 13 made of $n^-$-type SiC (for example, having a concentration of $1 \times 10^{15}$ to $1 \times 10^{17}$ $cm^{-3}$) formed on the substrate. The $n^-$-type epitaxial layer 13 is a layer formed by causing SiC to epitaxially grow on a surface of the substrate. In the present preferred embodiment, the substrate and the $n^-$-type epitaxial layer 13 are shown as an example of a semiconductor layer of the present invention.

In a surface portion of the $n^-$-type epitaxial layer 13, a p-type well 14 (for example, having a concentration of $1 \times 10^{16}$ to $1 \times 10^{19}$ $cm^{-3}$) is formed in a manner extending across the active region 2 and the outer peripheral region 3. On the other hand, a region of a portion under the p-type well 14 in the $n^-$-type epitaxial layer 13 is an $n^-$-type drain region 15.

An $n^+$-type source region 6 is formed in a surface portion of the p-type well 14 in the active region 2, and exposed on the surface of the $n^-$-type epitaxial layer 13. In addition, the part of the p-type well 14 within the active region 2 is a p-type channel region 16 which is disposed in a manner contacting the $n^+$-type source region 6 and in which a channel is formed at the time of a transistor operation.

Moreover, the gate trench 5 and the source trench 7 are formed in a manner penetrating through the $n^+$-type source region 6 and the p-type channel region 16 (p-type well 14) to reach the $n^-$-type drain region 15. The gate trench 5 and the source trench 7 are, in the present preferred embodiment, formed with the same width and the same depth, but may be different in depth from each other. For example, the source trench 7 may be shallower or may be deeper than the gate trench 5.

Each unit cell 4 is separated into a prismatic portion 17 surrounded by the source trench 7 and an annular portion 18 disposed between the source trench 7 and the gate trench 5 and spaced apart from the prismatic portion 17 by the source trench 7. In the present preferred embodiment, the width $W_1$ of the annular portion 18 (distance between the source trench 7 and the gate trench 5) is, for example, 0.5 μm to 2.0 μm.

In a top portion of the prismatic portion 17, a $p^+$-type channel contact region 8 (for example, having a concentration of $1 \times 10^{18}$ to $1 \times 10^{21}$ $cm^{-3}$) is formed in a manner exposed on the surface of the $n^-$-type epitaxial layer 13. Accordingly, the $p^+$-type channel contact region 8 forms a part of the side face of the source trench 7. The $p^+$-type channel contact region 8, in the present preferred embodiment, has its deepest portion at a position higher than that of a bottom portion of the source trench 7, but the deepest portion is not particularly necessary at this position. As long as an uppermost portion of the $p^+$-type channel contact region 8 (in the present preferred embodiment, the part exposed on the surface of the $n^-$-type epitaxial layer 13) is at a position higher than that of the bottom portion of the source trench 7 and is contactable, said deepest portion may be at the same depth position as that of the bottom portion of the source trench 7 or may be deeper.

In the annular portion 18, an $n^+$-type source region 6 and a p-type channel region 16 are formed in order from the surface side. Accordingly, the $n^+$-type source region 6 and the p-type channel region 16 form parts of the side face of the gate trench 5, respectively. The $n^+$-type source region 6 is, in the present preferred embodiment, formed with the same depth as that of the $p^+$-type channel contact region 8.

Also, in the $n^-$-type epitaxial layer 13, a p-type layer 19 (for example, having a concentration of $1 \times 10^{16}$ to $1 \times 10^{19}$ $cm^{-3}$) serving as an example of a second conductivity-type layer of the present invention is formed in a manner continuing from the p-type channel region 16 and the $p^+$-type channel contact region 8. The p-type layer 19 is, in the present preferred embodiment, formed in a manner extending across the prismatic portion 17 and the annular portion 18 via the bottom portion of the source trench 7, and its inner region is in contact with the source trench 7 (exposed into the source trench 7). The p-type layer 19 is connected to the p-type channel region 16 at a portion lateral to the source trench 7 of the annular portion 18, and is connected to the $p^+$-type channel contact region 8 at a portion lateral to the source trench 7 of the prismatic portion 17. Thus, the p-type channel region 16 and the $p^+$-type channel contact region 8 are electrically connected via the p-type layer 19.

Also, the p-type layer 19 is also formed in a manner extending across outer peripheral edges of the gate trench 5 via a bottom portion of an outermost peripheral line of the gate trench 5, and is connected, at the outer peripheral edges, to the p-type well 14 extending to the outer peripheral region 3.

Also, the p-type layer 19 is, at the bottom portion of the source trench 7, formed to be thicker than a part at a side portion of the source trench 7. However, in the prismatic portion 17, a portion lateral to the source trench 7 is surrounded by the source trench 7, and ion implantation is uniformly performed from its periphery. Therefore, the p-type layer 19 is formed thicker than the part at the bottom portion of the source trench 7, so as to fill a part under the p'-type channel contact region 8.

Also, the p-type layer 19 is formed in a manner extending along the gate trench 5. In the present preferred embodiment, the p-type layer 19 is formed across the entire periphery of the annular portion 18 surrounded by the gate trench 5, in a manner not contacting the gate trench 5 (spaced from the gate trench 5). Accordingly, an $n^-$-type drain region 15 is disposed at a part of the side face of the gate trench 5, so that a current path at the time of channel formation can be secured.

The gate trench 5 is, in the present preferred embodiment, formed in a substantially U-shape in a sectional view having a side face and a bottom face. On an inner surface (side face and bottom face) of the gate trench 5, a gate insulating film 20 is formed such that its one surface and the other surface extend along the inner surface of the gate trench 5.

The gate insulating film 20 is, at the bottom portion of the gate trench 5, formed to be thicker than a part at a side portion of the gate trench 5. In the gate trench 5 having a substantially U-shape in a sectional view as in the present preferred embodiment, the relatively thick part of the gate insulating film 20 is a part that contacts the bottom face of the gate trench 5, and the relatively thin part is a part that contacts the side face of the gate trench 5. By making the insulating film thick at the bottom portion of the gate trench 5 where electric field concentration is likely to occur, withstand voltage in the bottom portion of the gate trench 5 can be improved. In addition, the side face and bottom face sometimes cannot be clearly distinguished depending on the shape of the gate trench 5, but in that case, it suffices that the gate insulating film 20 that contacts a face in a direction crossing the depth direction of the gate trench 5 is relatively thick.

Moreover, the inside of the gate insulating film 20 is filled back with a gate electrode 21. In the present preferred embodiment, the gate electrode 21 is buried in the gate trench 5 such that its upper face becomes substantially flush with the surface of the $n^-$-type epitaxial layer 13. The gate electrode 21 is opposed to the p-type channel region 16 via the gate insulating film 20. In each unit cell 4, by controlling a voltage to be applied to the gate electrode 21, an annular channel along the periphery of the unit cell 4 is formed in the p-type channel region 16. Then, a drain current that flows along the side face of the gate trench 5 toward the surface of the $n^-$-type epitaxial layer 13 can be caused to flow to the $n^+$-type source region 6 via the channel. A transistor operation of the semiconductor device 1 is thereby performed.

Similarly, the source trench 7 is also, in the present preferred embodiment, formed in a substantially U-shape in a sectional view having a side face and a bottom face. On an inner surface (side face and bottom face) of the source trench 7, a source trench insulating film 22 is formed such that its one surface and the other surface extend along the inner surface of the source trench 7.

The source trench insulating film 22 is, at the bottom portion of the source trench 7, formed to be thicker than a part at a side portion of the source trench 7. In addition, the side face and bottom face sometimes cannot be clearly distinguished depending on the shape of the source trench 7, but in that case, it suffices that the source trench insulating film 22 that contacts a face in a direction crossing the depth direction of the source trench 7 is relatively thick. Moreover, the inside of the source trench insulating film 22 is filled back with a trench buried layer 23. In the present preferred embodiment, the trench buried layer 23 is buried in the source trench 7 such that its upper face becomes substantially flush with the surface of the $n^-$-type epitaxial layer 13.

In the present preferred embodiment, the gate insulating film 20 and the source trench insulating film 22 are constituted of the same material, and the gate electrode 21 and the trench buried layer 23 are constituted of the same material.

For example, as the material for the gate insulating film 20 and the source trench insulating film 22, a film of any of $SiO_2$, AlON, $Al_2O_3$, $SiO_2$/AlON, $SiO_2$/AlON/$SiO_2$, $SiO_2$/SiN, and $SiO_2$/SiN/$SiO_2$ can be used, and more preferably, a film having a $SiO_2$ film containing nitrogen (N) is used. In addition, $SiO_2$/AlON means a laminated film of $SiO_2$ (lower side) and AlON (upper side). Providing a gate insulating film 20 constituted of a high-dielectric-constant (high-k) film of AlON, $Al_2O_3$, or the like allows an improvement in gate withstand voltage, so that device reliability can be improved. Further, providing a gate insulating film 20 constituted of a material having a $SiO_2$ film containing nitrogen (N) also allows an improvement in channel mobility.

As the material for the gate electrode 21 and the trench buried layer 23, polysilicon can be used, and more preferably, $n^+$-type polysilicon is used. The $n^+$-type polysilicon has a relatively low sheet resistance, which therefore allows increasing transistor switching speed.

In addition, the gate insulating film 20 and the source trench insulating film 22 may be constituted of materials different from each other. Similarly, the gate electrode 21 and the trench buried layer 23 may also be constituted of materials different from each other. For example, the gate electrode 21 may be a metal gate electrode containing any of Mo, W, Al, Pt, Ni, and Ti. The metal gate electrode can also make gate resistance relatively low, which therefore allows increasing transistor switching speed.

In a surface portion of the p-type well 14 in the outer peripheral region 3, a $p^+$-type well contact region 24 (for example, having a concentration of $1 \times 10^{18}$ to $1 \times 10^{21}$ $cm^{-3}$) is formed. The $p^+$-type well contact region 24 is, in the present preferred embodiment, in an annular shape in a manner surrounding the active region 2, and is formed with the same depth as that of the $p^+$-type channel contact region 8.

Also, outside of the p-type well 14 in the outer peripheral region 3, guard rings 9 are formed spaced from the p-type well 14.

The guard ring 9, in the present preferred embodiment, includes a trench 31 formed in the surface of the $n^-$-type epitaxial layer 13 and a p-type layer 32 (for example, having a concentration of $1 \times 10^{16}$ to $1 \times 10^{19}$ $cm^{-3}$) formed at, at least, a bottom portion of the trench 31. In the present preferred embodiment, the p-type layer 32 is formed at bottom and side portions of the trench 31, and is, at the bottom portion of the trench 31, formed to be thicker than a part at the side portion of the trench 31. Also, in the present preferred embodiment, the trench 31 is formed with the same depth as that of the gate trench 5, and the p-type layer 32 is formed with the same depth as that of the p-type layer 19.

Similar to the gate trench 5, in the trench 31, a trench buried layer 34 is buried via a trench insulating film 33. As the materials for the trench insulating film 33 and the trench buried layer 34, the same materials as those for the gate insulating film 20 and the gate electrode 21 can be used, respectively.

On the surface of the n⁻-type epitaxial layer 13, a surface insulating film 25 is formed so as to extend across the active region 2 and the outer peripheral region 3. The surface insulating film 25 is made of an insulator such as silicon oxide ($SiO_2$), for example. The surface insulating film 25 is formed such that an inner part 27 on the active region 2 becomes thinner than an outer part 26 on the outer peripheral region 3. In the present preferred embodiment, the inner part 27 on the active region 2 has a thickness of 5000 Å or less, and the outer part 26 on the outer peripheral region 3 has a thickness of about 5500 Å to 20000 Å. The surface insulating film 25 may be called an interlayer insulating film when a multilayer wiring structure is disposed thereon, which is not shown in FIG. 2.

In the surface insulating film 25, contact holes 28 that selectively expose the p⁺-type channel contact region 8, the source trench 7, and the n⁺-type source region 6 are formed for every unit cell 4 over the entire surface of the n⁻-type epitaxial layer 13. In the present preferred embodiment, a source portion 30 is defined in each unit cell 4 by the contact hole 28. Also, in the surface insulating film 25, a contact hole 29 that selectively exposes the p⁺-type well contact region 24 is formed over the entire surface of the n⁻-type epitaxial layer 13.

On the surface insulating film 25, a source pad 10 is formed. The source pad 10 is connected collectively to the p⁺-type channel contact regions 8 and the n⁺-type source regions 6 of all unit cells 4 and the p⁺-type well contact region 24 via the respective contact holes 28 and 29. In other words, the source pad 10 serves as a common electrode to all unit cells 4. Also, as the material for the source pad 10, a metal containing copper (Cu) may be used, and more preferably, a metal containing an Al—Cu-based alloy is used. Because the sheet resistance of the source pad 10 can thereby be reduced, the current density can be increased. Also, the source pad 10 has a thickness (distance from the surface of the n⁻-type epitaxial layer 13 to a surface of the source pad 10) of, for example, 4 μm to 5 μm. In addition, the source pad 10 may have a contact metal made of, for example, a laminated structure (Ti/TiN) of titanium (Ti) and titanium nitride (TiN) at a connection part with the n⁻-type epitaxial layer 13.

On the other hand, the gate pad 12 (refer to FIG. 1(a)) is electrically connected to the gate electrode 21 via a gate wiring (not shown) or the like.

FIG. 3A to FIG. 3K are schematic views showing in the order of steps a part of a process for manufacturing the semiconductor device according to the first preferred embodiment of the present invention.

For manufacturing the semiconductor device 1, as shown in FIG. 3A, an n-type impurity is doped into the surface of a SiC substrate (not shown) while SiC crystals are caused to grow thereon by epitaxy such as a CVD method, an LPE method, or an MBE method. An n⁻-type epitaxial layer 13 is thereby formed on the SiC substrate. In addition, as the n-type impurity, for example, N (nitride), P (phosphorous), As (arsenic), or the like can be used.

Next, a p-type impurity is selectively ion-implanted from the surface of the n⁻-type epitaxial layer 13. A p-type well 14 (p-type channel region 16) is thereby formed. In addition, as the p-type impurity, for example, Al (aluminum), B (boron), or the like can be used. Also, simultaneously with formation of the p-type well 14, the rest of the n⁻-type epitaxial layer 13 is formed as an n⁻-type drain region 15.

Next, as shown in FIG. 3B, an n-type impurity is selectively ion-implanted from the surface of the n⁻-type epitaxial layer 13. An n⁺-type source region 6 is thereby formed.

Next, as shown in FIG. 3C, the n⁻-type epitaxial layer 13 is selectively etched by use of a mask having openings in regions where the gate trench 5, the source trenches 7, and the trenches 31 are to be formed. An n⁻-type epitaxial layer 13 is thereby dry-etched from the surface in a manner penetrating through the n⁺-type source region 6 and the p-type channel region 16, so that a gate trench 5, source trenches 7, and trenches 31 are simultaneously formed. In conjunction therewith, the n⁻-type epitaxial layer 13 is defined into a plurality of unit cells 4 by the gate trench 5. The unit cells 4 are to have prismatic portions 17 and annular portions 18. Also, as an etching gas, for example, a mixed gas ($SF_6/O_2$ gas) containing $SF_6$ (sulfur hexafluoride) and $O_2$ (oxygen), a mixed gas ($SF_6/O_2$/HBr gas) containing $SF_6$, $O_2$, and HBr (hydrogen bromide), or the like can be used.

Figure 3D:
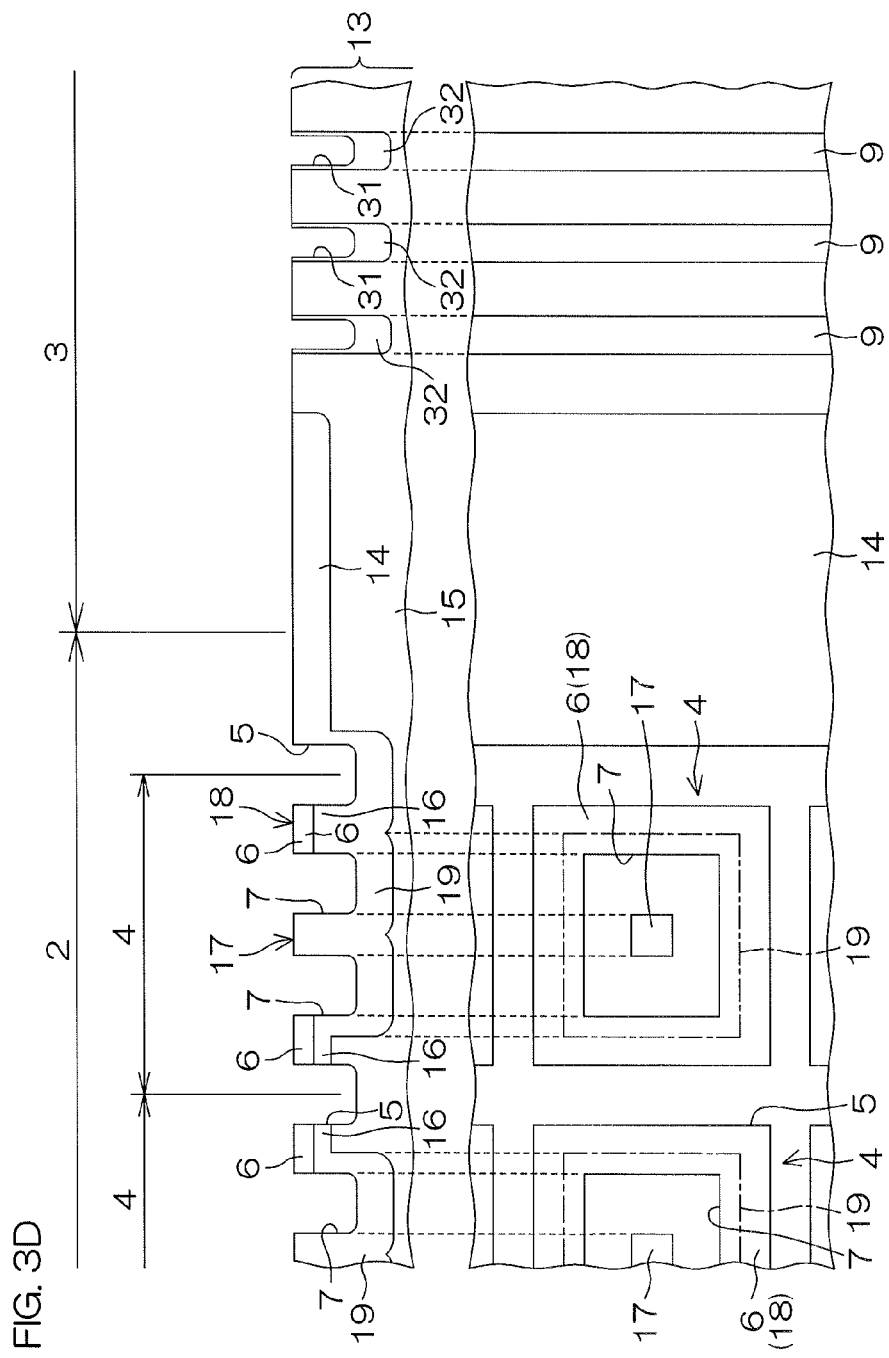
FIG. 3D is a view showing a step following that of FIG. 3C.

Next, as shown in FIG. 3D, a p-type impurity is selectively ion-implanted from the surface of the n⁻-type epitaxial layer 13. The p-type impurity is implanted, for example, in a direction perpendicular to the surface of the n⁻-type epitaxial layer 13. A p-type layer 19 and a p-type layer 32 are thereby simultaneously formed. In addition, the p-type layer 19 and the p-type layer 32 may be formed by separate ion implantation steps.

Next, as shown in FIG. 3E, a p-type impurity is selectively ion-implanted from the surface of the n⁻-type epitaxial layer 13. P⁺-type channel contact regions 8 and a p⁺-type well contact region 24 are thereby simultaneously formed.

Next, the n⁻-type epitaxial layer 13 is thermally treated at 1400° C. to 2000° C., for example. The ions of the p-type impurity and n-type impurity implanted into the n⁻-type epitaxial layer 13 are thereby activated.

Figure 3F:
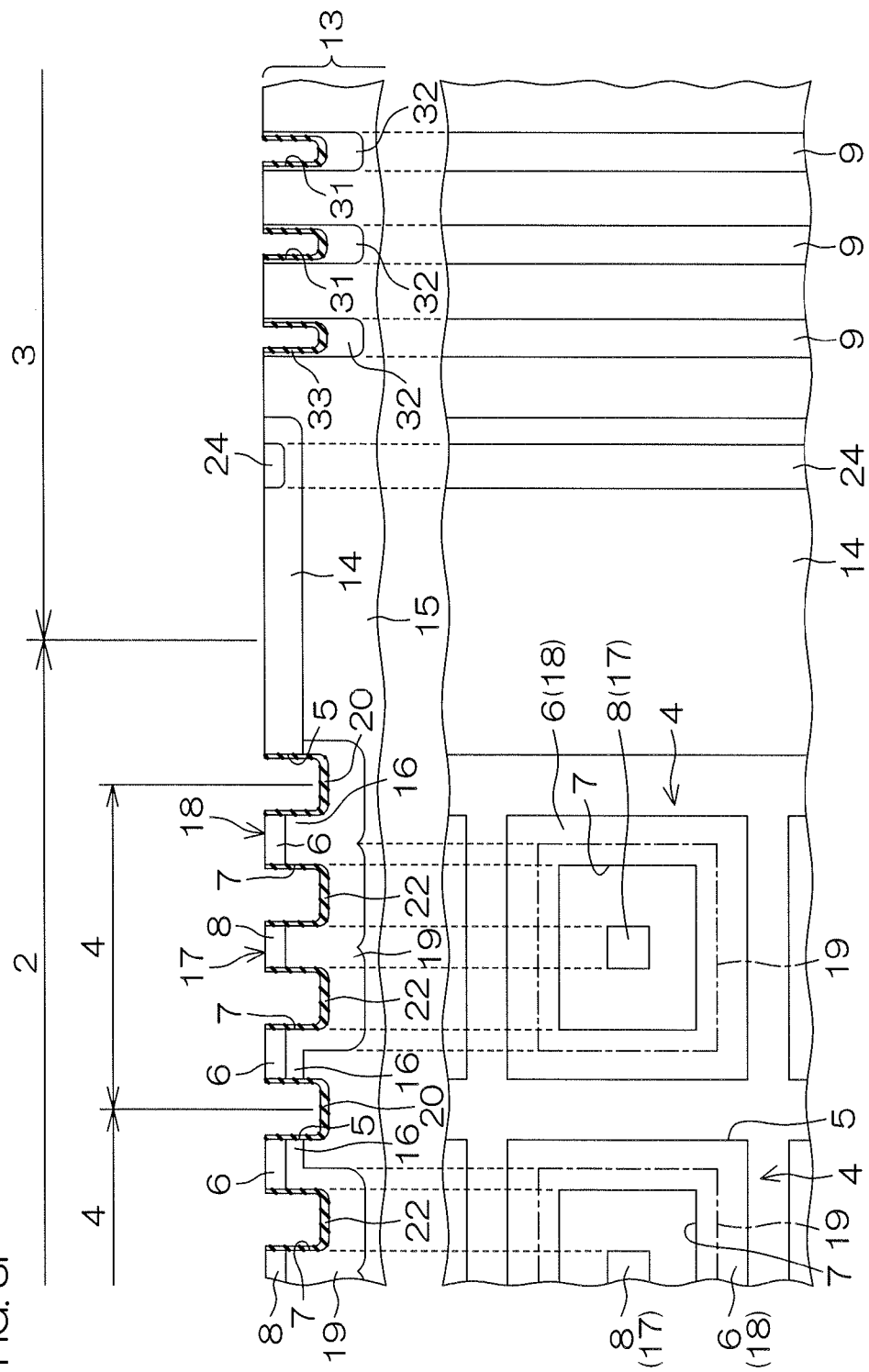
FIG. 3F is a view showing a step following that of FIG. 3E.

Next, as shown in FIG. 3F, a gate insulating film 20, a source trench insulating film 22, and a trench insulating film 33 are simultaneously formed by, for example, thermal oxidization. In addition, when the gate insulating film 20, the source trench insulating film 22, and the trench insulating film 33 are constituted of high-dielectric-constant (high-k) films, it suffices to deposit a film material by a CVD method.

Figure 3G:
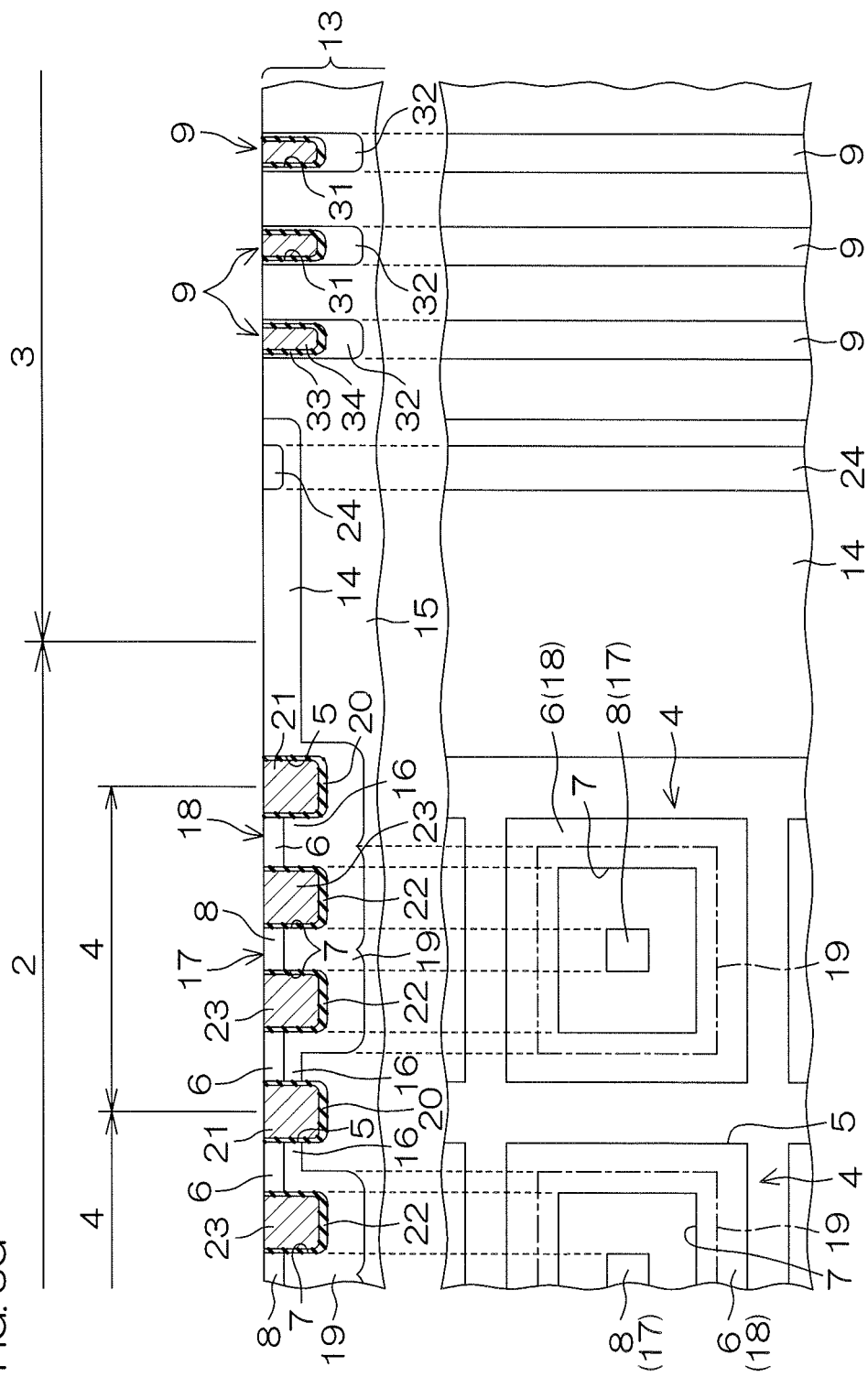
FIG. 3G is a view showing a step following that of FIG. 3F.

Next, as shown in FIG. 3G, a polysilicon material doped with an n-type impurity is deposited from above the n⁻-type epitaxial layer 13 by, for example, a CVD method. The deposition of the polysilicon material is continued until at least the gate trench 5, the source trenches 7, and the trenches 31 have been completely filled back. Thereafter, the deposited polysilicon material is etched back until its etched-back face becomes flush with the surface of the n⁻-type epitaxial layer 13. A gate electrode 21 and trench buried layers 23 and 34 are thereby simultaneously formed.

Figure 3H:
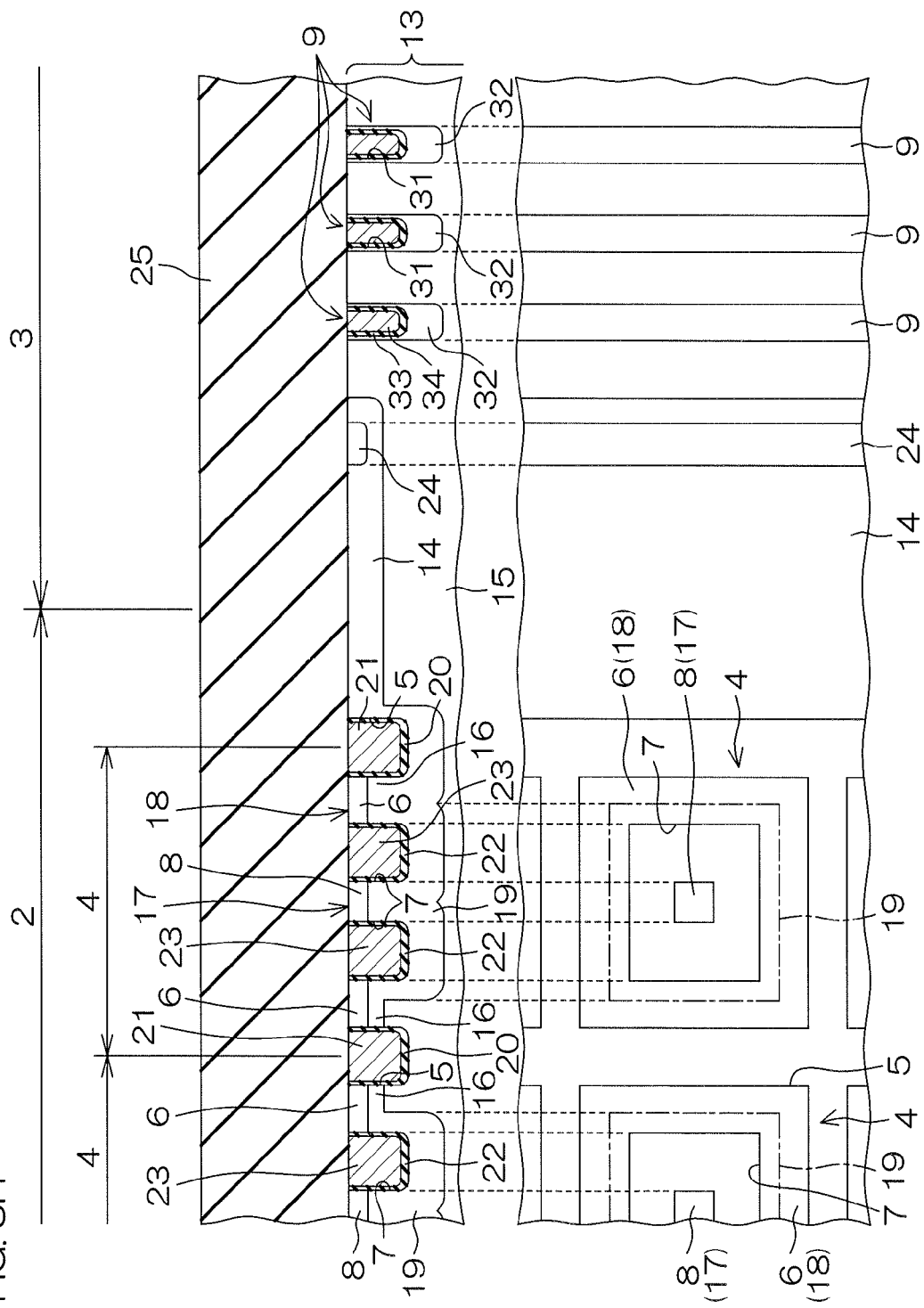
FIG. 3H is a view showing a step following that of FIG. 3G.

Next, as shown in FIG. 3H, an insulating material such as $SiO_2$ is deposited from above the n⁻-type epitaxial layer 13 by, for example, a CVD method. A surface insulating film 25 is thereby formed.

Figure 3I:
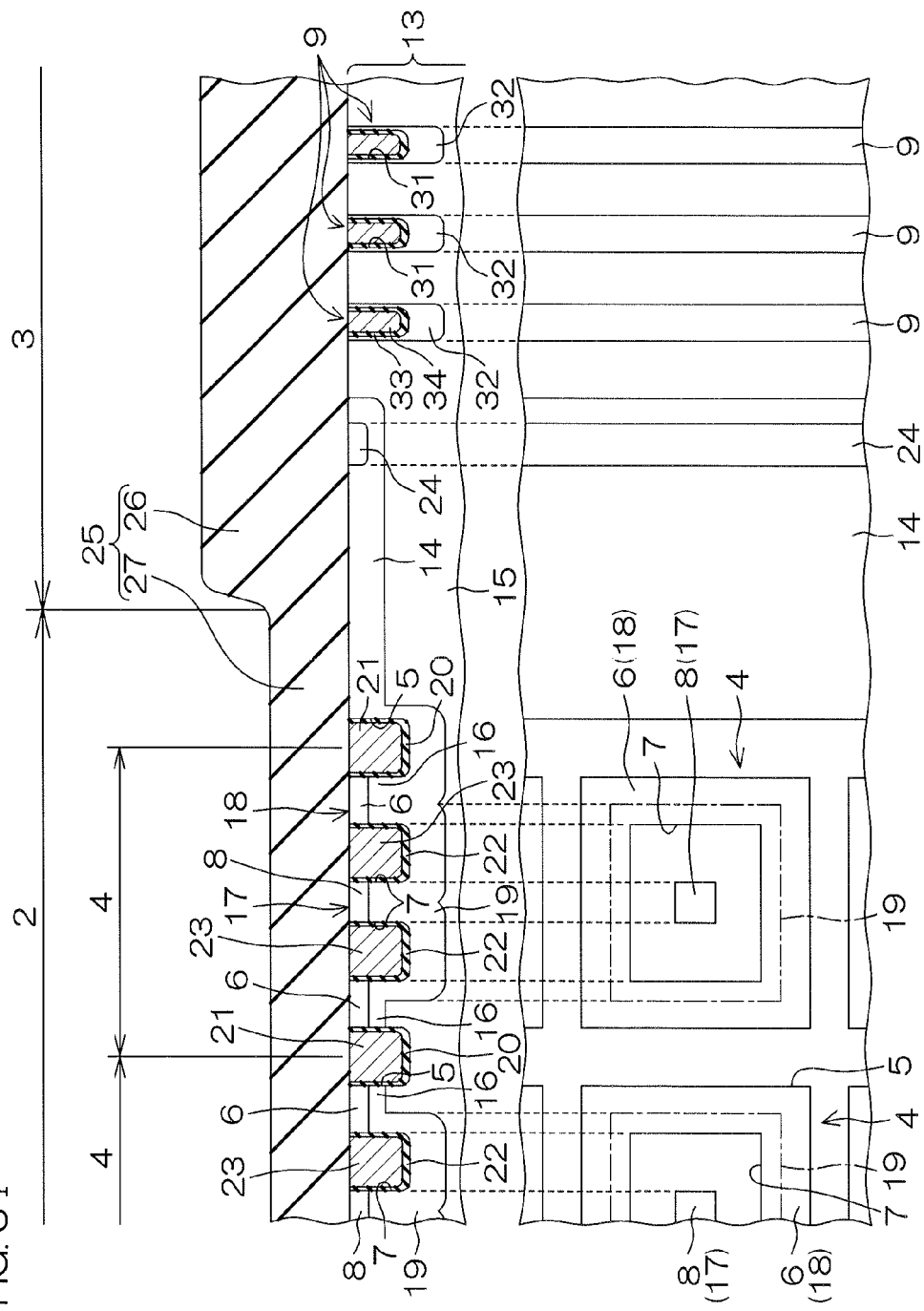
FIG. 3I is a view showing a step following that of FIG. 3H.

Next, as shown in FIG. 3I, a part on the active region 2 of the surface insulating film 25 is selectively etched. Only said part is thereby thinned, so that an inner part 27 and an outer pert 26 of the surface insulating film 25 are formed.

Figure 3J:
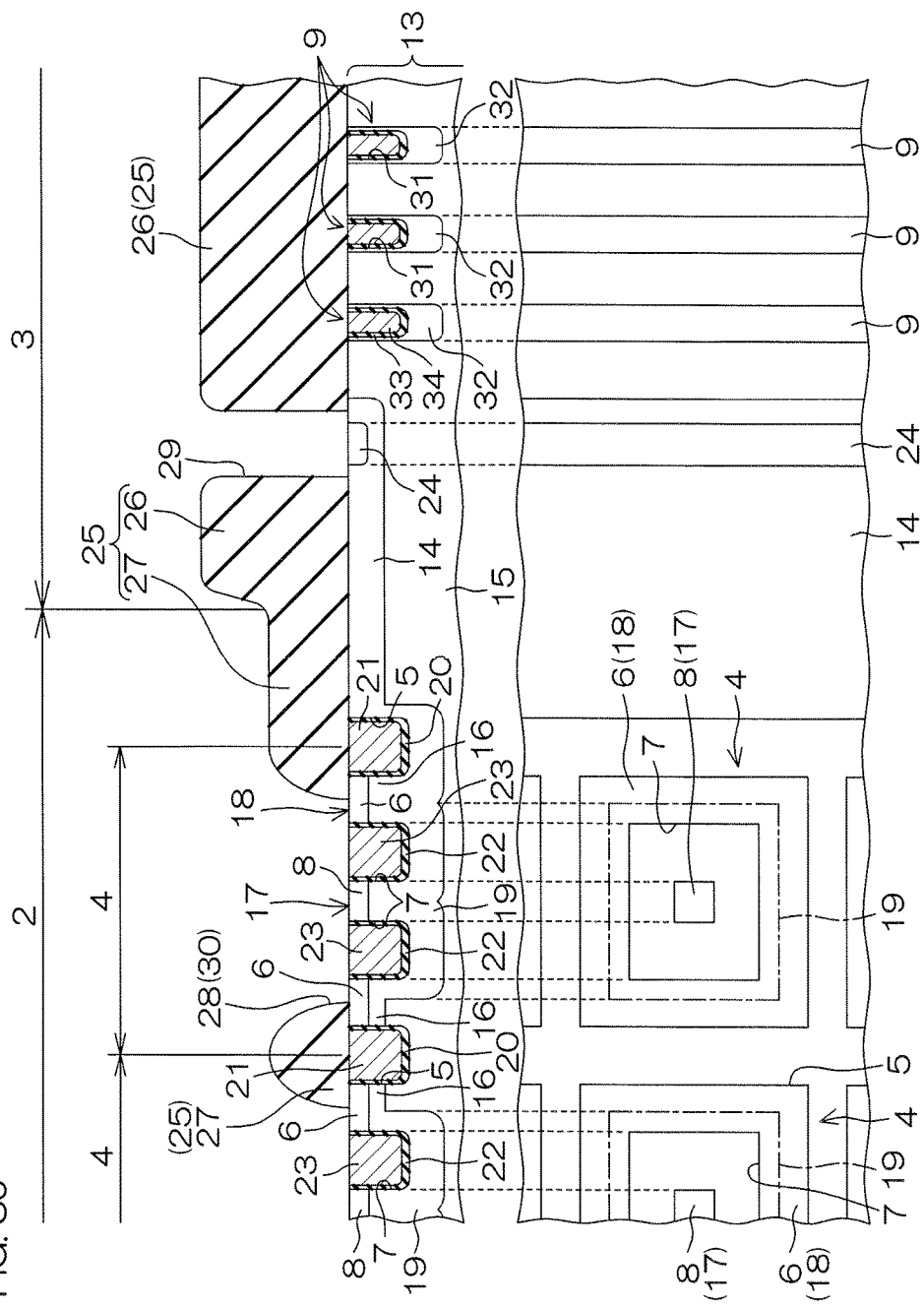
FIG. 3J is a view showing a step following that of FIG. 3I.

Next, as shown in FIG. 3J, by the surface insulating film 25 being selectively etched, contact holes 28 and 29 are simultaneously formed.

Figure 3K:
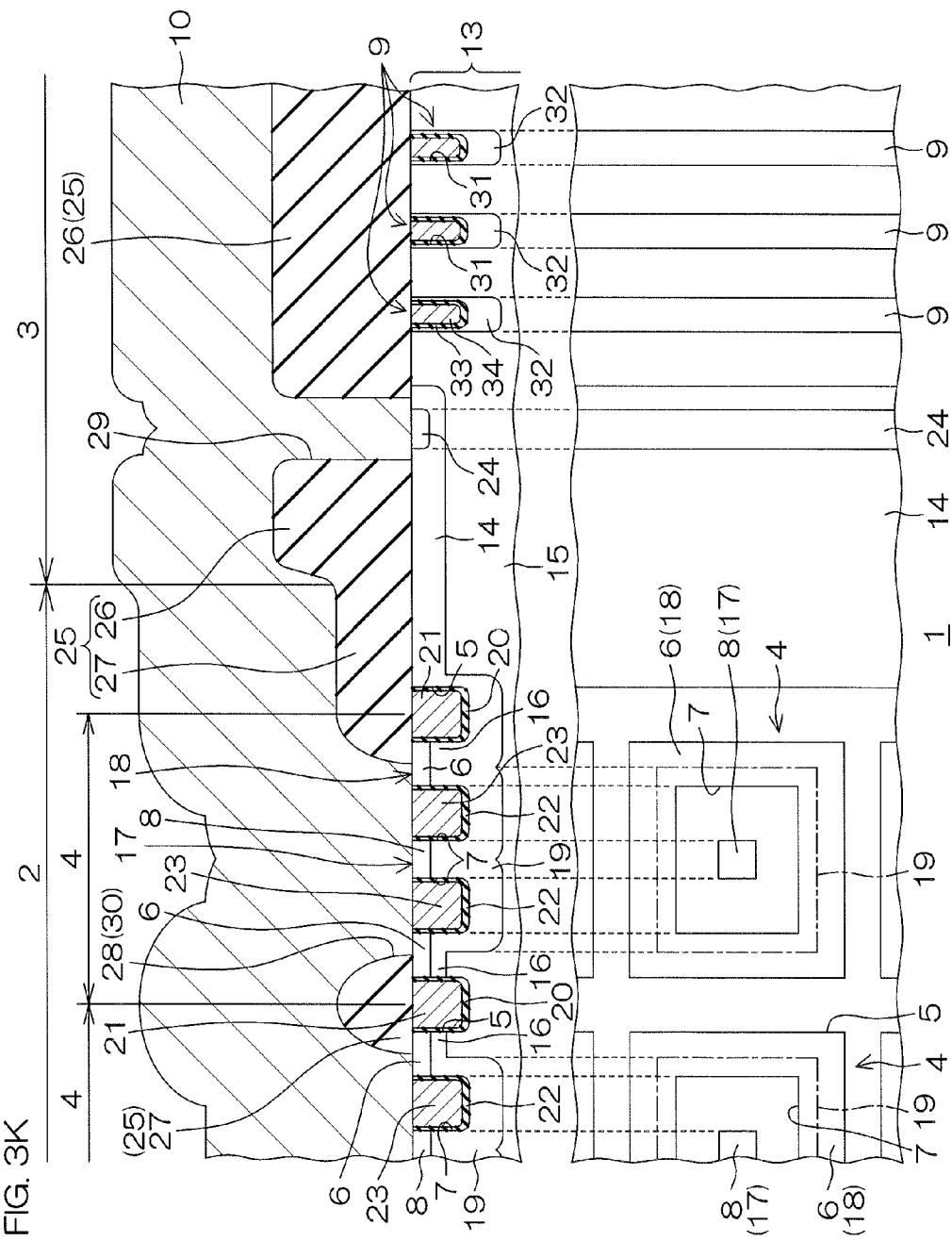
FIG. 3K is a view showing a step following that of FIG. 3J.

Next, as shown in FIG. 3K, a metal material is deposited from above the n⁻-type epitaxial layer 13 by, for example, a sputtering method. Then, by patterning said material, a source pad 10 is formed. The semiconductor device 1 shown in FIG. 2 is obtained through the above steps.

As above, according to the present semiconductor device 1, the trench buried layer 23 is buried in the source trenches 7 via the trench insulating film 22. Therefore, on the surface of the n⁻-type epitaxial layer 13 (device surface), a difference in level (unevenness) between the source portions 30 exposed from the contact holes 28 and other parts can be reduced. The flatness of the source pad 10 on said device surface can thereby be improved. Thus, when, for example, a wire is bonded to the surface of the source pad 10, adhesion between the source pad 10 and the wire can be improved. As a result, the wire can be satisfactorily bonded, so that the wire bonding portion can be improved in reliability. Further, because the source pad 10 is excellent in flatness, destruction of the device by ultrasonic vibration and pressure can be prevented at the time of wire bonding, and a decline in assembling yield can be prevented.

On the other hand, a concentration of equipotential surfaces in a vicinity of the bottom portion of the gate trench 5 can be prevented by the source trench 7, so that a potential gradient in the vicinity of the bottom port ion can be made gradual. Therefore, an electric field concentration to the bottom portion of the gate trench 5 can be relaxed. Further, the p⁺-type channel contact region 8 is formed in the top portion of the prismatic portion 17 and is disposed at a position higher than that of the bottom portion of the source trench 7. Thus, even when there is formed a source trench 7, contact with the p-type channel region 16 can be reliably made via the p⁺-type channel contact region 8. In other words, at the time of an improvement in flatness of the source pad 10, a degradation in device performance such as gate withstand voltage and contact performance with the p-type channel region 16 can be prevented.

Further, in the present preferred embodiment, because the p-type layer 19 is formed around the source trench 7, a depletion layer can be generated from a junction (p-n junction) between the p-type layer 19 and the n⁻-type drain region 15. Moreover, because the depletion layer keeps equipotential surfaces away from the gate trench 5, electric fields to be imposed on the bottom portion of the gate trench 5 can be further relaxed.

Also, in the present preferred embodiment, because a SiC device in which latch-up is unlikely to occur as compared with a Si device is used, the p⁺-type channel contact region 8 and the p-type channel region 16 can be provided at positions separated from each other by the source trench 7. That is, in a Si device, because latch-up is relatively likely to occur, it is preferable to dispose the p⁺-type channel contact region 8 near the p-type channel region 16 to reduce the distance between the regions 8 and 16 as short as possible so as to lower a base resistance between said regions 8 and 16. On the other hand, in such a SiC device as the present semiconductor device 1, because latch-up is relatively unlikely to occur and the importance of considering a base resistance between the regions 8 and 16 is low, the p⁺-type channel contact region 8 does not need to be disposed near the p-type channel region 16. Thus, the p⁺-type channel contact region 8 and the p-type channel region 16 can be provided at positions separated from each other by the source trench 7 to electrically connect the regions 8 and 16 by a route through the bottom portion of the source trench 7.

Also, because the source trench insulating film 22 is disposed outside of the trench buried layer 23, flow of an off-leakage current between the n⁻-type epitaxial layer 13 and the source pad 10 can be prevented. Specifically, the p-type layer 19 is, at a side portion of the source trench 7, thinner than a part at the bottom portion of the source trench 7 because ions are unlikely to enter a portion lateral to the source trench 7 at the time of ion implantation. Therefore, when a high voltage is applied at OFF-time, an off-leakage current may flow passing through the thin part of the p-type layer 19. Therefore, forming a source trench insulating film 22 allows reliably interrupting a leakage current by the source trench insulating film 22 even if an off-leakage current passes through the p-type layer 19.

Also, if the trench buried layer 23 buried in the source trench 7 is polysilicon, when forming contact holes 28 in the surface insulating film 25 made of SiO₂ (FIG. 3J), the trench buried layer 23 (polysilicon layer) can be used as an etching stopper. Therefore, control of the step of said contact etching can be simply performed.

Also, because the source trenches 7 are formed simultaneously with the gate trench 5 (FIG. 3C), the source trenches 7 can be simply formed without increasing the manufacturing process. Further, if the source trenches 7 and the gate trench 5 are the same width, the etching rate for the source trenches 7 can be made the same as that for the gate trench 5, so that etching for forming the source trenches 7 can be stably controlled.

Second Preferred Embodiment

Figure 4:
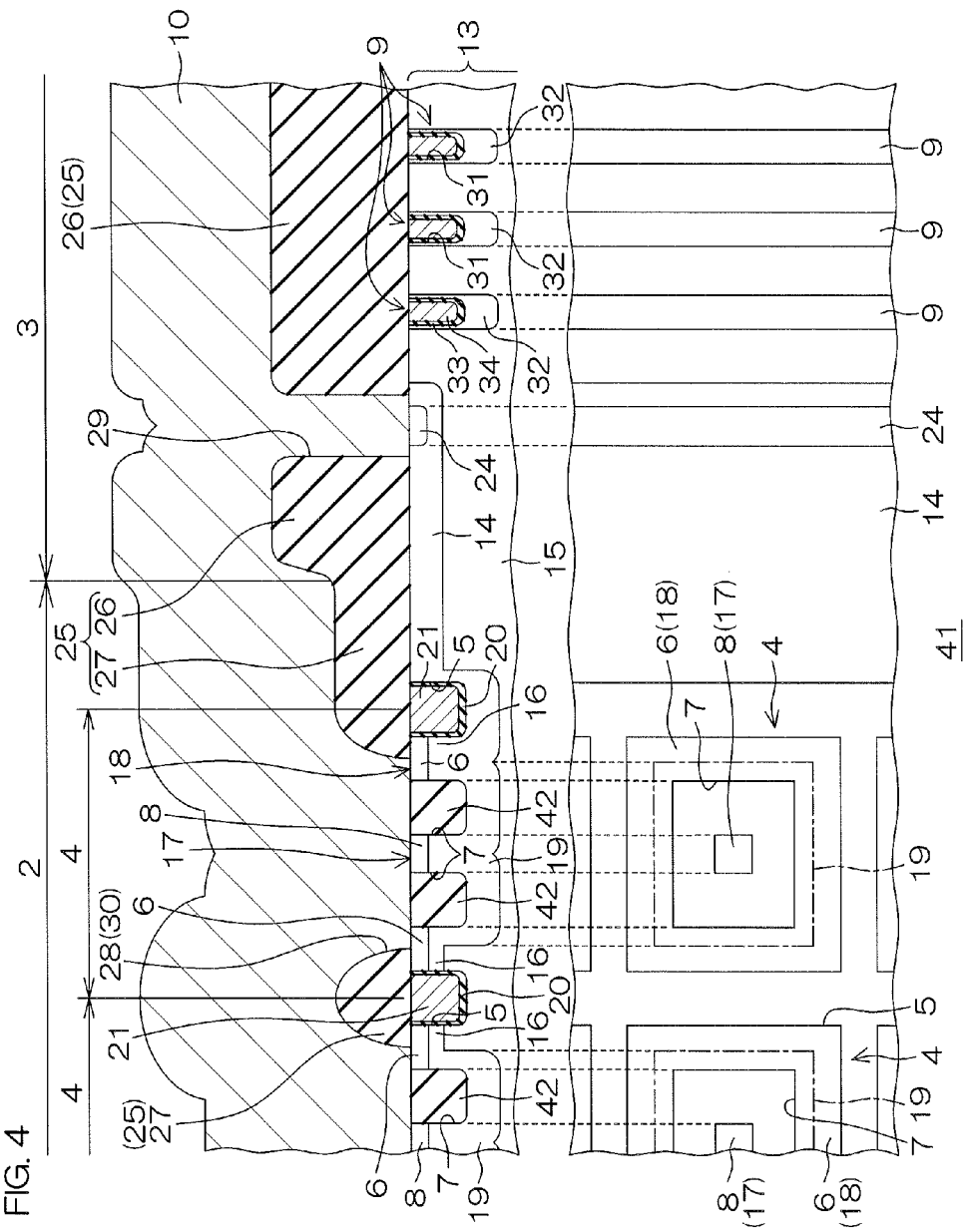
FIG. 4 is an enlarged view showing a main part of a semiconductor device according to a second preferred embodiment of the present invention, in which an upper side of the figure shows a sectional view and a lower side of the figure shows a plan view.

FIG. 4 is an enlarged view showing a main part of a semiconductor device according to a second preferred embodiment of the present invention, in which an upper side of the figure shows a sectional view, and a lower side of the figure shows a plan view. In FIG. 4, parts corresponding to the respective portions shown in FIG. 1 and FIG. 2 described above are shown with the same reference signs.

In the first preferred embodiment described above, the trench buried portion buried in the source trench 7 consists of the source trench insulating film 22 and the trench buried layer 23 (polysilicon layer), but as in the present semiconductor device 41, it may consist only of an insulating layer 42 that fills back the source trenches 7.

As the material for the insulating layer 42, SiO₂ can be used, and more preferably, SiO₂ containing phosphorus (P) or boron (B) is used. As such SiO₂, for example, PSG (phosphorus silicate glass) or PBSG (phosphorus boron silicate glass) can be used.

Figure 5A:
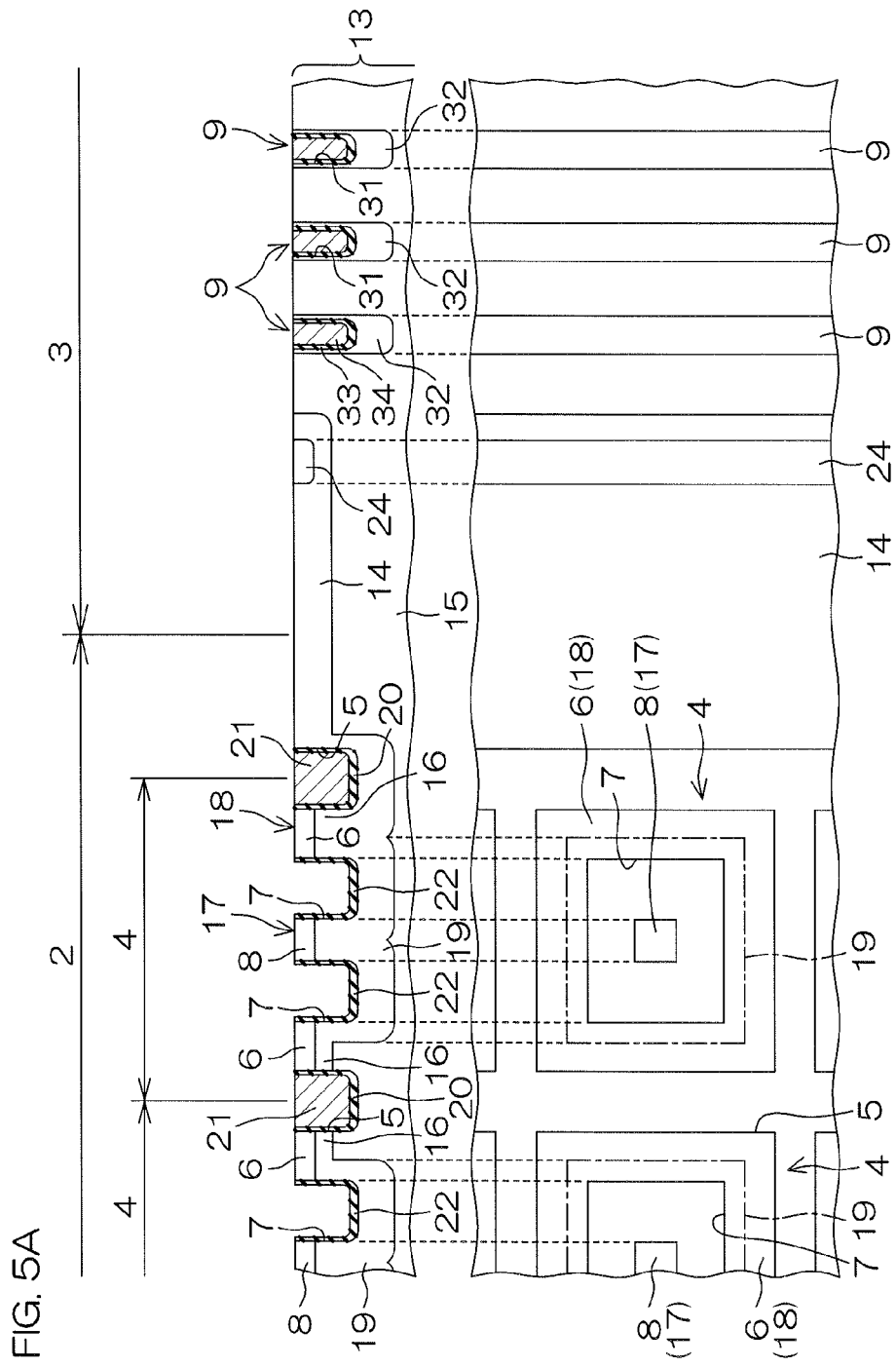
FIG. 5A is a schematic view showing apart of a process for manufacturing the semiconductor device according to the second preferred embodiment of the present invention.
Figure 5B:
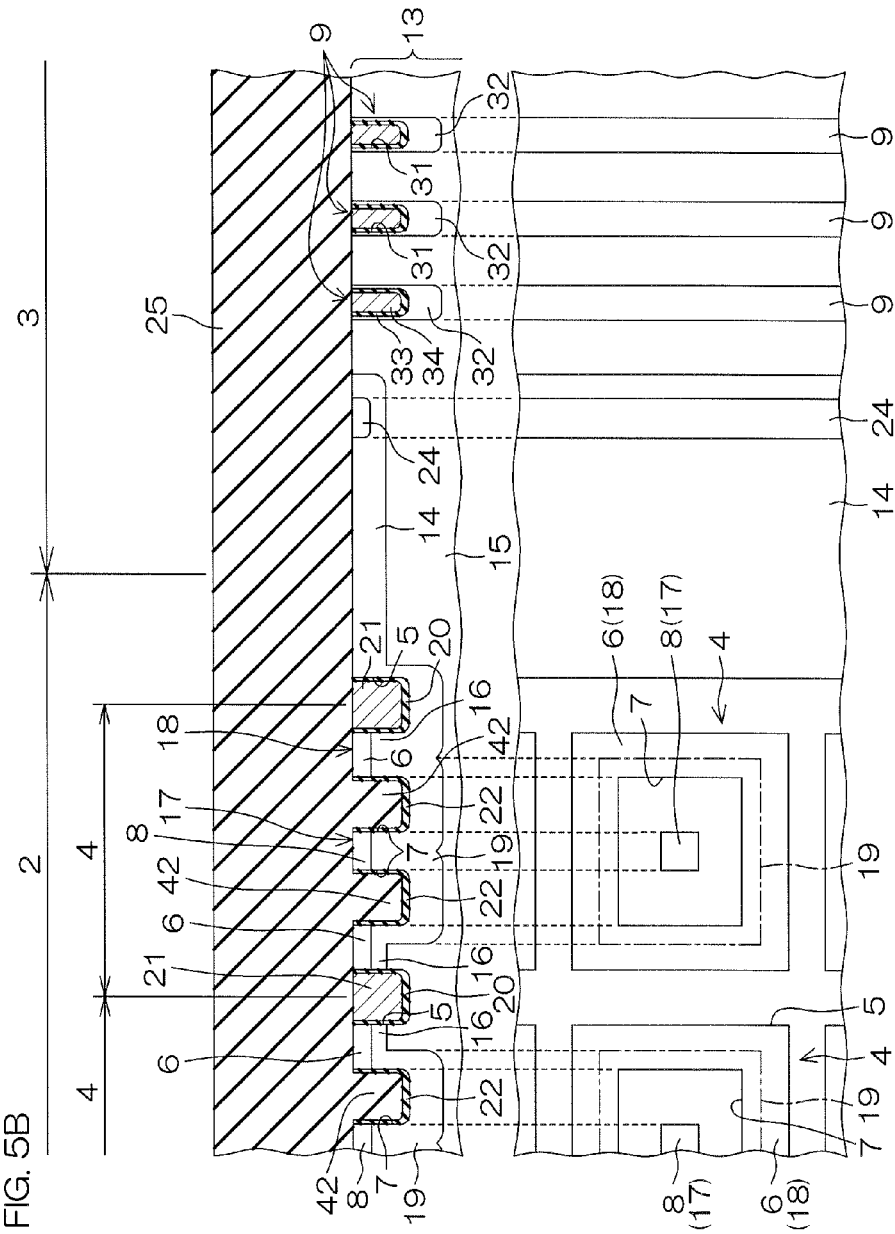
FIG. 5B is a view showing a step following that of FIG. 5A.

A process for manufacturing the semiconductor device 41 according to the present preferred embodiment is substantially the same as the steps shown in FIG. 3A to FIG. 3K. However, after a gate electrode 21 and trench buried layers 23 and 34 are formed in the step of FIG. 3G, as shown in FIG. 5A, the trench buried layer 23 is selectively etched to be removed, so that the source trenches 7 are made hollow. Then, as shown in FIG. 5B, a surface insulating film 25 is formed on the n⁻-type epitaxial layer 13 to thereby fill back the source trenches 7 by use of apart of the surface insulating film 25. The source trench insulating film 22 and the surface insulating film 25 are thereby integrated inside the source trenches 7, so that an insulating layer 42 is formed.

According to the present semiconductor device 41, because the source trenches 7 are filled with the insulating layer 42, flow of an off-leakage current between the n⁻-type epitaxial layer 13 and the source pad 10 can be effectively prevented.

Also, if the insulating layer 42 is SiO₂ containing phosphorous or boron, because the melting point of SiO₂ falls, the process for burying the insulating layer 42 can be simply performed.

Of course, in the present semiconductor device 41 as well, the same effects as those of the first preferred embodiment can also be realized.

Third Preferred Embodiment

Figure 6:
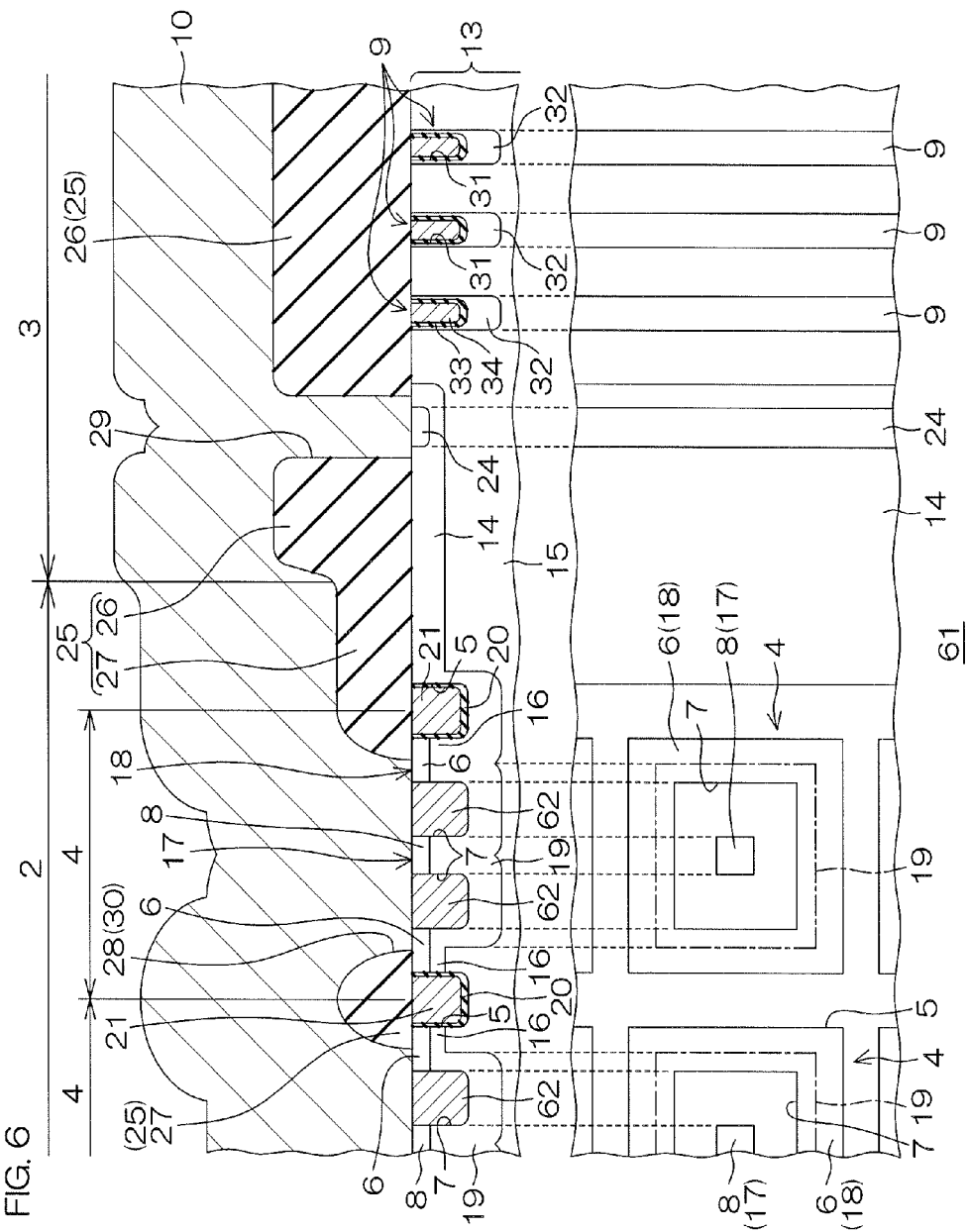
FIG. 6 is an enlarged view showing a main part of a semiconductor device according to a third preferred embodiment of the present invention, in which an upper side of the figure shows a sectional view and a lower side of the figure shows a plan view.

FIG. 6 is an enlarged view showing a main part of a semiconductor device according to a third preferred embodiment of the present invention, in which an upper side of the figure shows a sectional view, and a lower side of the figure shows a plan view. In FIG. 6, parts corresponding to the respective portions shown in FIG. 1 and FIG. 2 described above are shown with the same reference signs.

In the first preferred embodiment described above, the trench filling portion buried in the source trench 7 consists of the source trench insulating film 22 and the trench buried layer 23 (polysilicon layer), but as in the present semiconductor device 61, it may consist only of a polysilicon layer 62 that fills back the source trenches 7. As the material for the polysilicon layer 62, $p^+$-type polysilicon is preferably used.

Figure 7A:
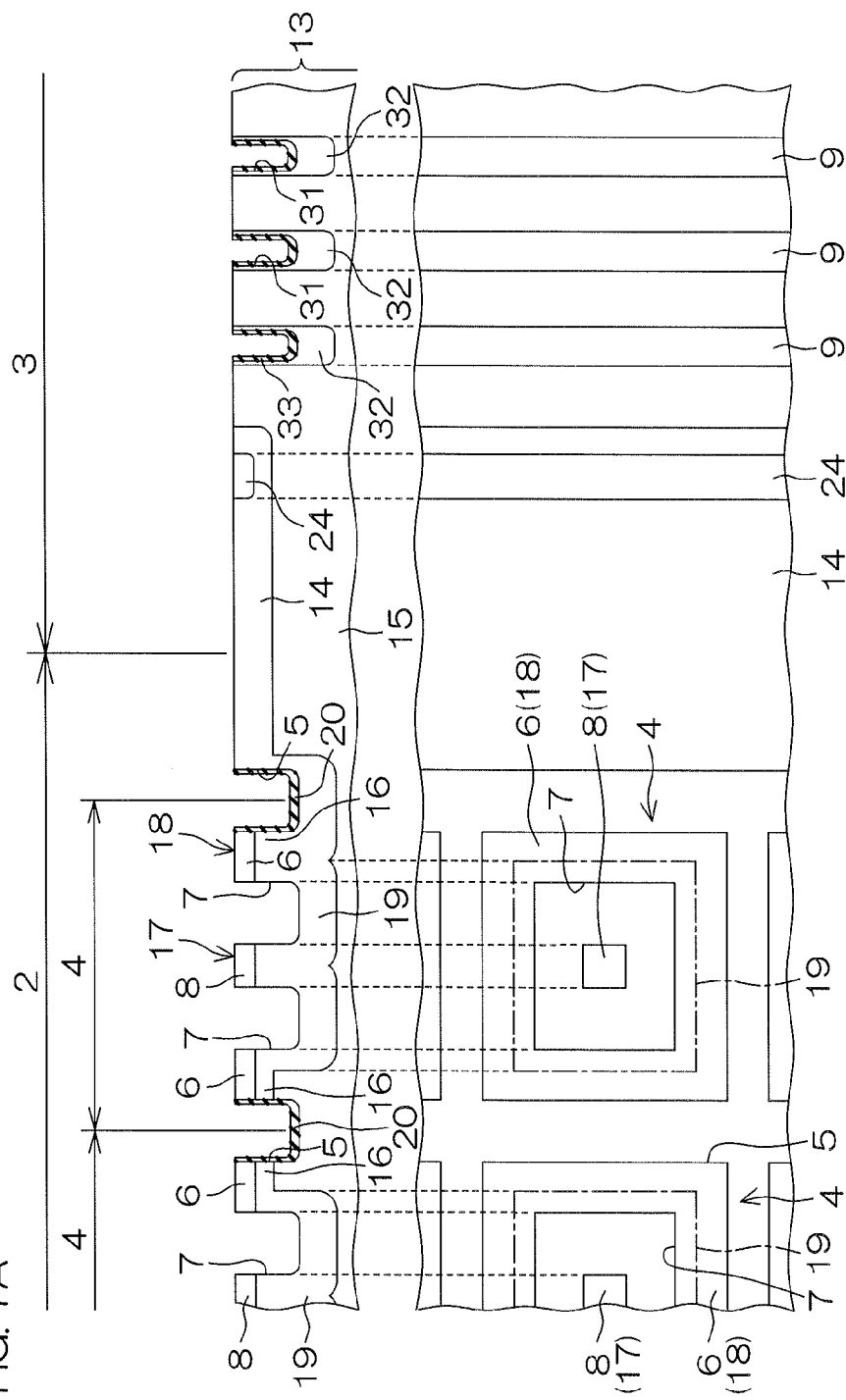
FIG. 7A is a schematic view showing a part of a process for manufacturing the semiconductor device according to the third preferred embodiment of the present invention.
Figure 7B:
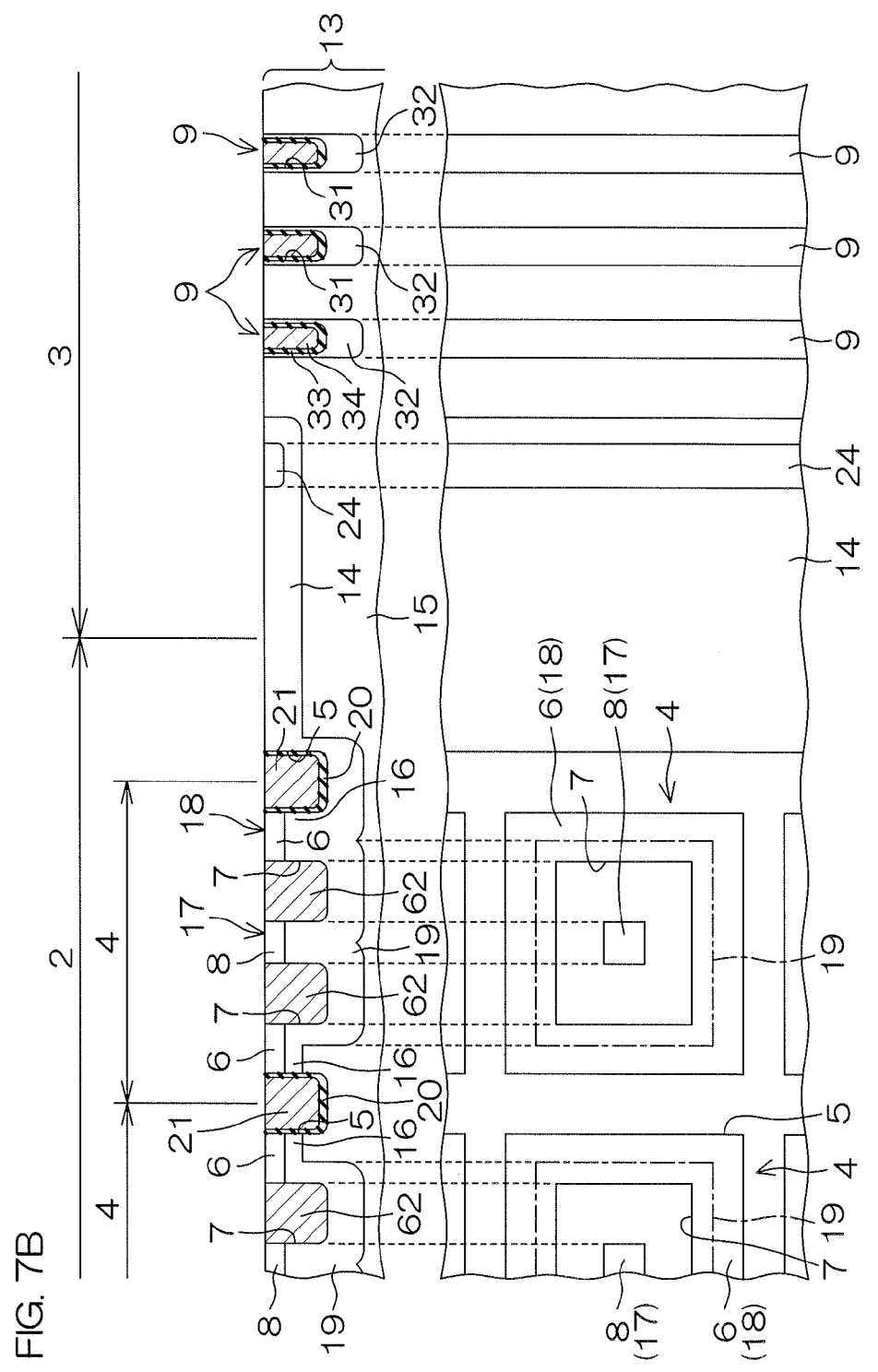

A process for manufacturing the semiconductor device 61 according to the present preferred embodiment is substantially the same as the steps shown in FIG. 3A to FIG. 3K. However, after a gate insulating film 20, a source trench insulating film 22, and a trench insulating film 33 are formed in the step of FIG. 3F, as shown in FIG. 7A, the source trench insulating film 22 is selectively etched to be removed, so that the source trenches 7 are made hollow. Then, as shown in FIG. 7B, by polysilicon being deposited from above the $n^-$-type epitaxial layer 13, the source trenches 7 are filled back with that polysilicon. A gate electrode 21 and a polysilicon layer 62 are thereby simultaneously formed.

According to the present semiconductor device 61, because the polysilicon layer 62 is buried in the source trenches 7, when forming contact holes 28 in the surface insulating film 25 made of $SiO_2$ (FIG. 3J), the polysilicon layer 62 can be used as an etching stopper. Therefore, control of the step of said contact etching can be simply performed.

Also, if the polysilicon layer 62 is $p^+$-type polysilicon, the $p^+$-type channel contact region 8 and the p-type channel region 16 can be electrically connected by use of the polysilicon layer 62. Because the length of a current path between the regions 8 and 16 can thereby be reduced, a base resistance therebetween can be reduced. As a result, latch-up can be satisfactorily prevented. Further, because the $p^+$-type channel contact region 8 is in contact with the polysilicon layer 62 at a side face of the source trench 7, a contact resistance therebetween can also be reduced. The reduction in contact resistance also contributes to a reduction in the base resistance between the regions 8 and 16.

Of course, in the present semiconductor device 61 as well, the same effects as those of the first preferred embodiment can also be realized.

Although preferred embodiments of the present invention have been described above, the present invention can be embodied in other forms.

For example, an arrangement may be adopted in which the conductivity type of each semiconductor part of each semiconductor device (1, 41, 61) is inverted. For example, in the semiconductor devices 1, the p-type parts may be n-type and the n-type parts may be p-type.

Also, in the semiconductor device (1, 41, 61), the layer that constitutes a semiconductor layer is not limited to an $n^-$-type epitaxial layer made of SiC, and may be a layer or the like made of GaN, diamond, or Si.

Figure 8:
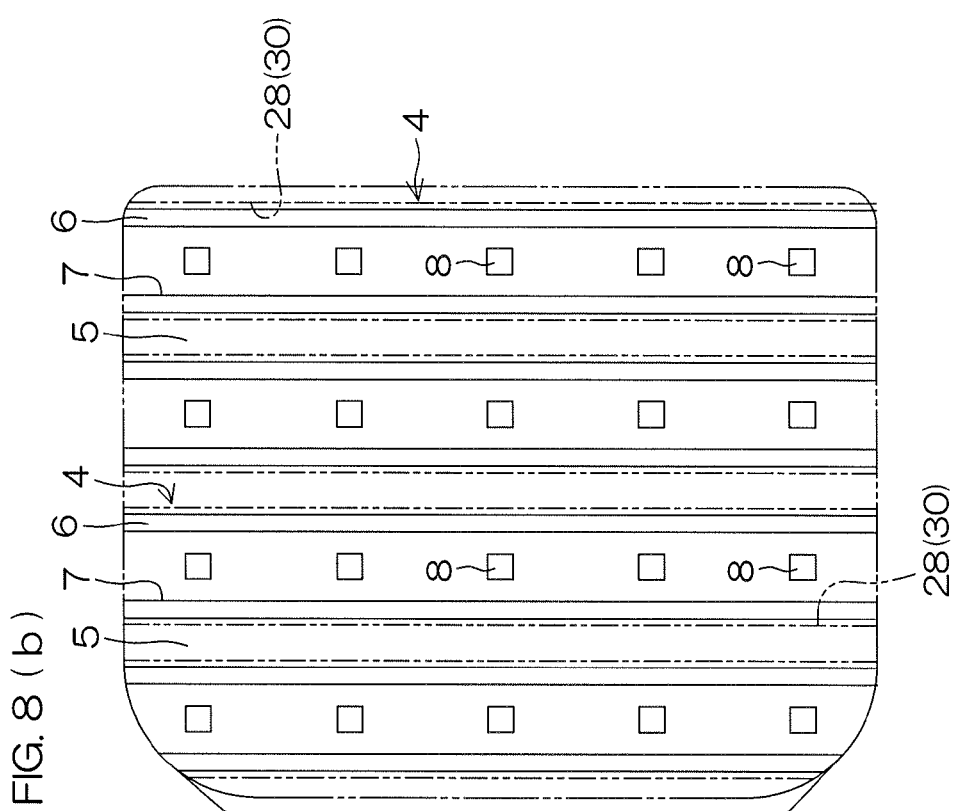
FIG. 8 is a view showing a modification of the layout of unit cells.
Figure 8:
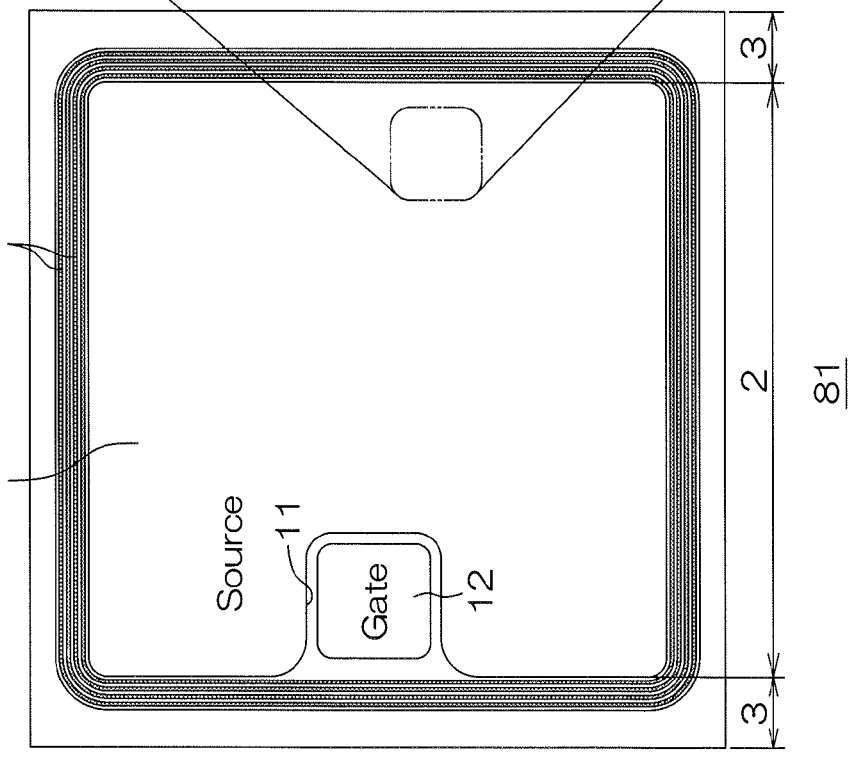

Also, each unit cell 4 is not limited to a square shape in a plan view (quadrangular shape), but may have another shape such as, for example, a triangular shape in a plan view, a pentagonal shape in a plan view, or a hexagonal shape in a plan view, and may further have a stripe shape as in the semiconductor device 81 of FIG. 8.

Also, in the preferred embodiment described above, an example has been mentioned in which the source trench 7 is formed in an annular shape and the channel contact region 8 is disposed inside thereof, but the source trench 7 need not to be an annular shape. For example, the source trench 7 may be formed in a recessed shape such as a triangle, quadrangle, circle, or oblong in a plan view and the channel contact region 8 may be disposed outside thereof.

Also, the guard ring 9 is a structure including the trench 31 formed in the surface of $n^-$-type epitaxial layer 13 and the p-type layer 32 formed in, at least, the bottom portion of the trench 31, but may be a structure consisting only of, for example, p-type semiconductor regions.

The semiconductor device of the present invention can be incorporated in, for example, a power module for use in an inverter circuit that constitutes a drive circuit for driving an electric motor available as a power source for an electric vehicle (including a hybrid vehicle), an electric train, an industrial robot, and the like. Additionally, the semiconductor device of the present invention can also be incorporated in a power module for use in an inverter circuit that converts electric power generated by a solar cell, a wind power generator, and other power generators (particularly, private electric generators) so as to be matched with electric power from commercial power sources.

Also, the features grasped from the disclosures of the preferred embodiments described above may be combined with each other even among different preferred embodiments. Also, the components presented in the respective preferred embodiments may be combined within the scope of the present invention.

The preferred embodiments of the present invention are merely specific examples used to clarify the technical content of the present invention, and the present invention should not be interpreted as being limited to these specific examples, and the spirit and scope of the present invention shall be limited solely by the accompanying claims.

The present application corresponds to Japanese Patent Application No. 2013-30018 filed on Feb. 19, 2013 in the Japan Patent Office, and the entire disclosure of this application is incorporated herein by reference.

REFERENCE SIGNS LIST

1 Semiconductor device
2 Active region
3 Outer peripheral region
4 Unit cell
5 Gate trench
6 $N^+$-type source region
7 Source trench
8 $P^+$-type channel contact region
10 Source pad
13 $N^-$-type epitaxial layer
14 P-type well
15 $N^-$-type drain region
16 P-type channel region
19 P-type layer
20 Gate insulating film
21 Gate electrode
22 Source trench insulating film 23 Trench buried layer
25 Surface insulating film
26 Outer part (of surface insulating film)
27 Inner part (of surface insulating film)
28 Contact hole
30 Source portion
41 Semiconductor device
42 Insulating layer
61 Semiconductor device
62 Polysilicon layer
81 Semiconductor device

The invention claimed is:

1. A semiconductor device comprising:
   a semiconductor layer of a first conductivity type formed with a gate trench;
   a gate electrode buried in the gate trench via a gate insulating film;
   a source region of a first conductivity type disposed in a manner exposed on a surface of the semiconductor layer, forming a part of a side face of the gate trench;
   a channel region of a second conductivity type disposed for the source region on a back surface side of the semiconductor layer in a manner contacting the source region, forming a part of the side face of the gate trench;
   a drain region of a first conductivity type disposed for the channel region on the back surface side of the semiconductor layer in a manner contacting the channel region, forming a bottom face of the gate trench;
   a second trench selectively formed in a source portion defined in a manner containing the source region in the surface of the semiconductor layer;
   a trench buried portion buried in the second trench;
   a channel contact region of a second conductivity type selectively disposed at a position higher than that of a bottom portion of the second trench in the source portion, electrically connected with the channel region;
   a surface metal layer disposed on the source portion, electrically connected to the source region and the channel contact region; and
   a second conductivity-type layer formed at the bottom portion and a side portion of the second trench in a manner continuing from the channel region and the channel contact region.

2. The semiconductor device according to claim 1, wherein the trench buried portion consists of an insulating film formed on an inner surface of the second trench and a polysilicon layer buried inside of the insulating film.

3. The semiconductor device according to claim 2, wherein the insulating film is made of any of $SiO_2$, AlON, $Al_2O_3$, $SiO_2$/AlON, $SiO_2$/AlON/$SiO_2$, $SiO_2$/SiN, and $SiO_2$/SiN/$SiO_2$.

4. The semiconductor device according to claim 2, wherein the insulating film has a $SiO_2$ film containing nitrogen (N).

5. The semiconductor device according to claim 2, wherein the insulating film is, at the bottom portion of the second trench, formed to be thicker than a part at a side portion of the second trench.

6. The semiconductor device according to claim 2, wherein the polysilicon layer is made of $n^+$-type polysilicon.

7. The semiconductor device according to claim 1, wherein the trench buried portion consists of an insulating layer that fills back the second trench.

8. The semiconductor device according to claim 7, wherein the insulating layer is made of $SiO_2$.

9. The semiconductor device according to claim 8, wherein the insulating layer is made of $SiO_2$ containing phosphorus (P) or boron (B).

10. The semiconductor device according to claim 1, wherein the trench buried portion consists of a polysilicon layer that fills back the second trench.

11. The semiconductor device according to claim 10, wherein the polysilicon layer is made of $p^+$-type polysilicon.

12. The semiconductor device according to claim 1, wherein the gate electrode is a metal gate electrode containing any of Mo, W, Al, Pt, Ni, and Ti.

13. The semiconductor device according to claim 1, wherein the surface metal layer is made of a metal containing copper (Cu).

14. The semiconductor device according to claim 13, wherein the surface metal layer includes an Al—Cu-based alloy.

15. The semiconductor device according to claim 1, wherein the second trench has an annular structure surrounding the channel contact region.

16. The semiconductor device according to claim 1, wherein the second trench has a width the same as that of the gate trench.

17. The semiconductor device according to claim 1, wherein the semiconductor layer has an active region that forms a channel in the channel region to perform a transistor operation and an outer peripheral region disposed around the active region, and
   the semiconductor device further comprises a surface insulating film disposed in a manner extending across the active region and the outer peripheral region, and in the active region, formed to be thinner than a part in the outer peripheral region.

18. The semiconductor device according to claim 17, wherein the surface insulating film has a thickness of 5000 Å or less in the active region.

19. The semiconductor device according to claim 17, wherein in the surface insulating film, a contact hole that selectively exposes the source portion is formed over the entire surface of the semiconductor layer.

20. The semiconductor device according to claim 1, wherein in the semiconductor layer, a unit cell that forms a channel in the channel region to perform a transistor operation are defined in a grid shape by the gate trench.

21. The semiconductor device according to claim 1, wherein in the semiconductor layer, a unit cell that forms a channel in the channel region to perform a transistor operation are defined in a striped shape by the gate trench.

22. The semiconductor device according to claim 1, wherein the semiconductor layer is made of SiC, GaN, or diamond.

23. A method for manufacturing a semiconductor device comprising:
   a step of simultaneously forming, in a semiconductor layer formed with a source region of a first conductivity type, a channel region of a second conductivity type, and a drain region of a first conductivity type in order from a surface side to a back surface side in a manner contacting each other, a gate trench and a second trench that penetrate through the source region and the channel region from the surface to reach the drain region;
   a step of selectively forming a channel contact region of a second conductivity type to be electrically connected with the channel region, at a position higher than that of a bottom portion of the second trench in the semiconductor layer;

a step of burying a gate electrode via a gate insulating film in the gate trench;

a step of burying a trench buried portion in the second trench;

a step of selectively exposing a source portion containing the source region, the channel contact region, and the trench buried portion in the surface of the semiconductor layer, and selectively covering a part other than the source portion;

a step of forming, on the source portion, a surface metal layer to be electrically connected to the source region and the channel contact region; and a step of forming a second conductivity-type layer at the bottom portion and a side portion of the second trench in a manner continuing from the channel region and the channel contact region.

24. The method for manufacturing a semiconductor device according to claim 23, wherein the step of burying the trench buried portion includes a step of forming an insulating film on an inner surface of the second trench and then burying a polysilicon layer inside of the insulating film.

25. The method for manufacturing a semiconductor device according to claim 23, wherein the step of burying the trench buried portion includes a step of filling back the second trench with an insulating layer.

26. The method for manufacturing a semiconductor device according to claim 23, wherein the step of burying the trench buried portion includes a step of filling back the second trench with a polysilicon layer.

27. The method for manufacturing a semiconductor device according to claim 23, wherein the step of forming the gate trench and the second trench includes a step of forming a gate trench and a second trench being the same width as each other.

* * * * *